(12) United States Patent
Xu

(10) Patent No.: US 11,899,057 B2
(45) Date of Patent: Feb. 13, 2024

(54) METHOD FOR IDENTIFYING LATCH-UP STRUCTURE

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 185 days.

(21) Appl. No.: 17/657,275

(22) Filed: Mar. 30, 2022

(65) Prior Publication Data

US 2023/0008364 A1 Jan. 12, 2023

Related U.S. Application Data

(63) Continuation of application No. PCT/CN2021/122641, filed on Oct. 8, 2021.

(30) Foreign Application Priority Data

Jul. 8, 2021 (CN) .......................... 202110773251.3

(51) Int. Cl.
*G01R 31/28* (2006.01)
*H01L 21/66* (2006.01)

(52) U.S. Cl.
CPC ..... *G01R 31/2853* (2013.01); *G01R 31/2884* (2013.01); *H01L 22/14* (2013.01); *H01L 22/34* (2013.01)

(58) Field of Classification Search
CPC . G01R 31/2853; G01R 31/2884; H01L 22/14; H01L 22/34; H01L 27/0207; H01L 27/0921; G06F 30/398
See application file for complete search history.

(56) References Cited

U.S. PATENT DOCUMENTS

| 9,142,545 | B2 | 9/2015 | Chen |
| 10,930,650 | B2 | 2/2021 | Sharma |
| 2007/0158779 | A1 | 7/2007 | Cannon |
| 2015/0236010 | A1 | 8/2015 | Chen et al. |
| 2020/0006339 | A1* | 1/2020 | Sharma .................. H01L 29/74 |

(Continued)

FOREIGN PATENT DOCUMENTS

| CN | 1914514 B | 5/2010 |
| CN | 101996996 A | 3/2011 |

(Continued)

*Primary Examiner* — Giovanni Astacio-Oquendo
(74) *Attorney, Agent, or Firm* — Syncoda LLC; Feng Ma

(57) ABSTRACT

A method for identifying a latch-up structure includes the following: in a chip layout, a first N-type heavily doped region connected to a first input/output pad and located in a P-type substrate is found; a first P-type heavily doped region located in an N-well and a second P-type heavily doped region located in the P-type substrate, both of which are adjacent to the first N-type heavily doped region, are found; a second N-type heavily doped region adjacent to the first P-type heavily doped region and located in the N-well is found, wherein the N-well is located on the P-type substrate; and an area formed by the first P-type heavily doped region, the first N-type heavily doped region, the second P-type heavily doped region, the second N-type heavily doped region, the N-well and the P-type substrate is identified as the latch-up structure.

9 Claims, 28 Drawing Sheets

(56) References Cited

U.S. PATENT DOCUMENTS

| | | |
|---|---|---|
| 2021/0143151 A1 | 5/2021 | Sharma |
| 2022/0244307 A1* | 8/2022 | Xu .......................... G11C 29/24 |
| 2023/0043423 A1* | 2/2023 | Xu .......................... H01L 22/14 |

FOREIGN PATENT DOCUMENTS

| | | |
|---|---|---|
| CN | 103633087 B | 8/2016 |
| CN | 110660810 A | 1/2020 |
| CN | 110890343 A | 3/2020 |

\* cited by examiner

METHOD FOR IDENTIFYING LATCH-UP STRUCTURE

CROSS-REFERENCE TO RELATED APPLICATIONS

This is a continuation of International Patent Application No. PCT/CN2021/122641 filed on Oct. 8, 2021, which claims priority to Chinese Patent Application No. 202110773251.3 filed on Jul. 8, 2021. The disclosures of these applications are hereby incorporated by reference in their entity.

BACKGROUND

Reliability becomes more and more significant in semiconductor products, and latch-up is a highly significant item in reliability of semiconductor products. In a designed integrated circuit product, various latch-up paths may exist, and particularly in circuits connected to input/output pads (IO PADs), how to effectively detect these possible latch-up paths and use existing design rules to inspect whether the paths are safe become highly significant.

SUMMARY

In view of the above, embodiments of the disclosure provides a method for identifying a latch-up structure.

According to a first aspect of the embodiments of the disclosure, a method for identifying a latch-up structure is provided, which includes the following operations.

In a chip layout, a first negative-type (N-type) heavily doped region connected to a first input/output pad and located in a positive-type (P-type) substrate is found.

A first P-type heavily doped region located in an N-well and a second P-type heavily doped region located in the P-type substrate are found, both of which are adjacent to the first N-type heavily doped region.

A second N-type heavily doped region adjacent to the first P-type heavily doped region and located in the N-well is found. The N-well is located on the P-type substrate.

An area formed by the first P-type heavily doped region, the first N-type heavily doped region, the second P-type heavily doped region, the second N-type heavily doped region, the N-well and the P-type substrate is identified as the latch-up structure.

Or, in the chip layout, a first P-type heavily doped region connected to a first input/output pad and located in an N-well is found.

A first N-type heavily doped region located in a P-type substrate and a second N-type heavily doped region located in the N-well are found, both of which are adjacent to the first P-type heavily doped region.

A second P-type heavily doped region adjacent to the first N-type heavily doped region and located in the P-type substrate is found. The N-well is located on the P-type substrate.

An area formed by the first P-type heavily doped region, the first N-type heavily doped region, the second P-type heavily doped region, the second N-type heavily doped region, the N-well and the P-type substrate is identified as the latch-up structure.

According to a second aspect of the embodiments of the disclosure, a method for identifying a latch-up structure is provided, which includes the following operations.

In a chip layout, a first N-type heavily doped region connected to a first input/output pad and located in a first N-well is found.

A first P-type heavily doped region located in a second N-well and a second P-type heavily doped region located in a P-type substrate are found, both of which are adjacent to the first N-type heavily doped region.

A second N-type heavily doped region adjacent to the first P-type heavily doped region and located in the second N-well is found. The first N-well and the second N-well are both located on the P-type substrate.

An area formed by the first P-type heavily doped region, the first N-type heavily doped region, the second P-type heavily doped region, the second N-type heavily doped region, the first N-well, the second N-well and the P-type substrate is identified as the latch-up structure.

Or, in the chip layout, a first P-type heavily doped region connected to a first input/output pad and located in a second N-well is found.

A first N-type heavily doped region located in a first N-well and a second N-type heavily doped region located in the second N-well are found, both of which are adjacent to the first P-type heavily doped region.

A second P-type heavily doped region adjacent to the first N-type heavily doped region and located in a P-type substrate is found. The first N-well and the second N-well are both located on the P-type substrate.

An area formed by the first P-type heavily doped region, the first N-type heavily doped region, the second P-type heavily doped region, the second N-type heavily doped region, the first N-well, the second N-well and the P-type substrate is identified as the latch-up structure.

According to a third aspect of the embodiments of the disclosure, a method for identifying a latch-up structure is provided, which includes the following operations.

In a chip layout, a first N-type heavily doped region connected to a first input/output pad and located in a deep N-well is found.

A first P-type heavily doped region located in a second N-well and a second P-type heavily doped region located in a P-type substrate are found, both of which are adjacent to the first N-type heavily doped region.

A second N-type heavily doped region adjacent to the first P-type heavily doped region and located in the second N-well is found. The deep N-well is located in a first N-well, and the first N-well and the second N-well are both located on the P-type substrate.

An area formed by the first P-type heavily doped region, the first N-type heavily doped region, the second P-type heavily doped region, the second N-type heavily doped region, the deep N-well, the first N-well, the second N-well and the P-type substrate is identified as the latch-up structure.

Or, in the chip layout, a first P-type heavily doped region connected to a first input/output pad and located in a second N-well is found.

A first N-type heavily doped region located in a deep N-well and a second N-type heavily doped region located in the second N-well are found, both of which are adjacent to the first P-type heavily doped region.

A second P-type heavily doped region adjacent to the first N-type heavily doped region and located in a P-type substrate is found. The deep N-well is located in a first N-well, and the first N-well and the second N-well are both located on the P-type substrate.

An area formed by the first P-type heavily doped region, the first N-type heavily doped region, the second P-type heavily doped region, the second N-type heavily doped region, the deep N-well, the first N-well, the second N-well and the P-type substrate is identified as the latch-up structure.

According to a fourth aspect of the embodiments of the disclosure, a method for identifying a latch-up structure is provided, which includes the following operations.

In a chip layout, a first P-type heavily doped region connected to a first input/output pad and located in a deep N-well is found.

A first N-type heavily doped region located in a P-well and a second N-type heavily doped region located in the deep N-well are found, both of which are adjacent to the first P-type heavily doped region.

A second P-type heavily doped region adjacent to the first N-type heavily doped region and located in the P-well is found. The P-well is located in the deep N-well, the deep N-well is located in an N-well, and the N-well is located on the P-type substrate.

An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

Or, in the chip layout, a first N-type heavily doped region connected to a first input/output pad and located in a P-well is found.

A first P-type heavily doped region located in a deep N-well and a second P-type heavily doped region located in the P-well are found, both of which are adjacent to the first N-type heavily doped region.

A second N-type heavily doped region adjacent to the first P-type heavily doped region and located in the deep N-well is found. The P-well is located in the deep N-well, the deep N-well is located in an N-well, and the N-well is located on a P-type substrate.

An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

According to a fifth aspect of the embodiments of the disclosure, a method for identifying a latch-up structure is provided, which includes the following operations.

In a chip layout, a first P-type heavily doped region connected to a first input/output pad and located in a P-well is found.

A first N-type heavily doped region located in a P-type substrate and a second N-type heavily doped region located in an N-well are found, both of which are adjacent to the first P-type heavily doped region.

A second P-type heavily doped region adjacent to the first N-type heavily doped region and located in the P-type substrate is found. The P-well is located in a deep N-well, the deep N-well is located in the N-well, and the N-well is located on the P-type substrate.

An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

Or, in the chip layout, a first N-type heavily doped region connected to a first input/output pad and located in a P-type substrate is found.

A first P-type heavily doped region located in a P-well and a second P-type heavily doped region located in the P-type substrate are found, both of which are adjacent to the first N-type heavily doped region.

A second N-type heavily doped region adjacent to the first P-type heavily doped region and located in an N-well is found. The P-well is located in a deep N-well, the deep N-well is located in the N-well, and the N-well is located on the P-type substrate.

An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

According to a sixth aspect of the embodiments of the disclosure, a method for identifying a latch-up structure is provided, which includes the following operations.

In a chip layout, a first P-type heavily doped region connected to a first input/output pad and located in a P-well is found.

A first N-type heavily doped region located in a second N-well and a second N-type heavily doped region located in a first N-well are found, both of which are adjacent to the first P-type heavily doped region.

A second P-type heavily doped region adjacent to the first N-type heavily doped region and located in a P-type substrate is found. The P-well is located in a deep N-well, the deep N-well is located in the first N-well, and the first N-well and the second N-well are both located on the P-type substrate.

An area formed by the first P-type heavily doped region, the first N-type heavily doped region, the second P-type heavily doped region, the second N-type heavily doped region, the P-well, the deep N-well, the first N-well, the second N-well and the P-type substrate is identified as the latch-up structure.

Or, in the chip layout, a first N-type heavily doped region connected to a first input/output pad and located in a second N-well is found.

A first P-type heavily doped region located in a P-well and a second P-type heavily doped region located in a P-type substrate are found, both of which are adjacent to the first N-type heavily doped region.

A second N-type heavily doped region adjacent to the first P-type heavily doped region and located in a first N-well is found. The P-well is located in a deep N-well, the deep N-well is located in the first N-well, and the first N-well and the second N-well are both located on the P-type substrate.

An area formed by the first P-type heavily doped region, the first N-type heavily doped region, the second P-type heavily doped region, the second N-type heavily doped region, the P-well, the deep N-well, the first N-well, the second N-well and the P-type substrate is identified as the latch-up structure.

According to a seventh aspect of the embodiments of the disclosure, a method for identifying a latch-up structure is provided, which includes the following operations.

In a chip layout, a first P-type heavily doped region connected to a first input/output pad and located in a P-well is found.

A first N-type heavily doped region located in a second deep N-well and a second N-type heavily doped region located in a first N-well are found, both of which are adjacent to the first P-type heavily doped region.

A second P-type heavily doped region adjacent to the first N-type heavily doped region and located in a P-type substrate is found. The P-well is located in a first deep N-well, the first deep N-well is located in the first N-well, the second deep N-well is located in a second N-well, and the first N-well and the second N-well are both located on the P-type substrate.

An area formed by the first P-type heavily doped region, the first N-type heavily doped region, the second P-type heavily doped region, the second N-type heavily doped region, the P-well, the first deep N-well, the second deep N-well, the first N-well, the second N-well and the P-type substrate is identified as the latch-up structure.

Or, in the chip layout, a first N-type heavily doped region connected to a first input/output pad and located in a second deep N-well is found.

A first P-type heavily doped region located in a P-well and a second P-type heavily doped region located in a P-type substrate are found, both of which are adjacent to the first N-type heavily doped region.

A second N-type heavily doped region adjacent to the first P-type heavily doped region and located in a first N-well is found. The P-well is located in a first deep N-well, the first deep N-well is located in the first N-well, the second deep N-well is located in a second N-well, and the first N-well and the second N-well are both located on the P-type substrate.

An area formed by the first P-type heavily doped region, the first N-type heavily doped region, the second P-type heavily doped region, the second N-type heavily doped region, the P-well, the first deep N-well, the second deep N-well, the first N-well, the second N-well and the P-type substrate is identified as the latch-up structure.

In the embodiments of the disclosure, by finding a first N-type heavily doped region connected to a first input/output pad or a first P-type heavily doped region connected to a first input/output pad, and respectively finding another P-type or N-type heavily doped region by means of the first N-type heavily doped region or the first P-type heavily doped region, a latch-up structure connected to the first input/output pad is identified.

DETAILED DESCRIPTION

Figure 1A:
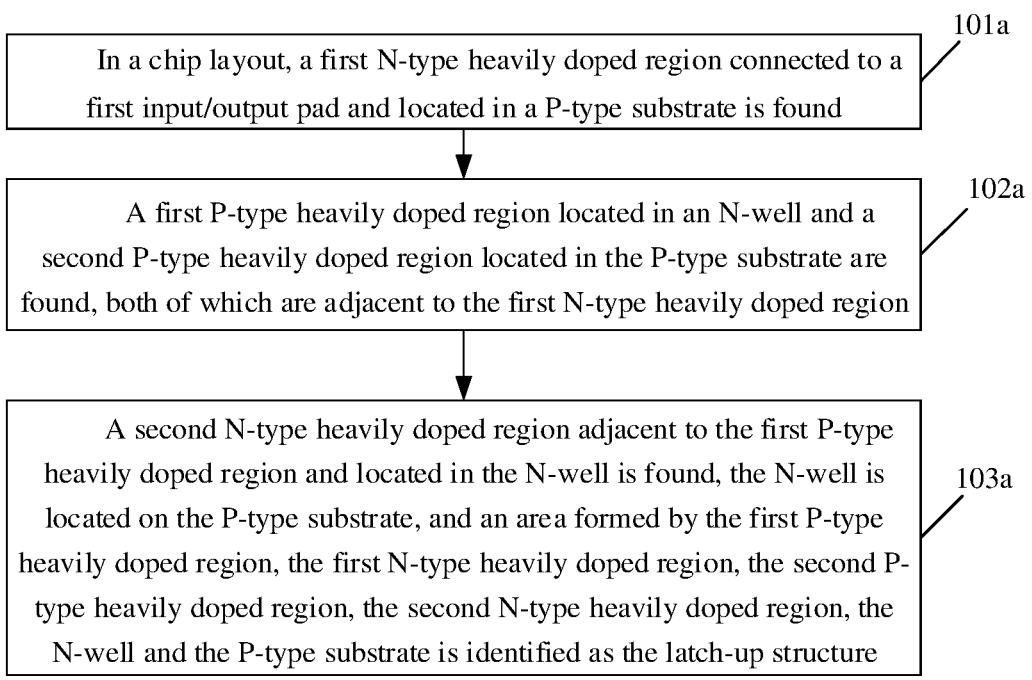
FIG. 1A is a schematic flowchart of a method for identifying a latch-up structure provided in an embodiment of the disclosure.

Exemplary implementations disclosed in embodiments of the disclosure are described in detail below with reference to the accompanying drawings. Although the accompanying drawings illustrate the exemplary implementations of the disclosure, it should be understood that the embodiments of the disclosure can be implemented in various forms, and should not be limited by the particular implementations described herein. On the contrary, the purpose of providing these implementations is to more thoroughly understand the embodiments of the disclosure, and the scope of the disclosure of the embodiments of the disclosure is fully conveyed to those skilled in the art.

In the following description, numerous specific details are provided for providing a more thorough understanding of the disclosure. However, it would be apparent to those skilled in the art that the embodiments of the disclosure can be implemented without one or more of these details. In other examples, in order to avoid confusion with the embodiments of the disclosure, some technical features known in the art are not described. That is, not all features of actual embodiments are described herein, and well-known functions and structures are not described in detail.

In the accompanying drawings, for clarity, the sizes of layers, areas and elements and their relative sizes may be exaggerated. Like reference numerals refer to like elements throughout.

It should be understood that when an element or layer is referred to as being "on", "adjacent to", "connected to" or "coupled to" other elements or layers, it can be directly on, adjacent to, connected to or coupled to the other elements or layers, or intervening elements or layers may be present. In contrast, when an element is referred to as being "directly on", "directly adjacent to", "directly connected to" or "directly coupled to" other elements or layers, intervening elements or layers are absent. It should be understood that although the terms first, second, third, etc., may be used to describe various elements, components, areas, layers and/or portions, those elements, components, areas, layers and/or portions may not be limited by these terms. The terms are merely used to distinguish one element, component, area, layer or portion from another element, component, area, layer or portion. Thus, a first element, component, area, layer or portion discussed below may be referred to as a second element, component, area, layer or portion without departing from the teachings of the embodiments of the disclosure. Moreover, when a second element, component, area, layer or portion is discussed, it does not mean that a first element, component, area, layer or portion is necessarily present in the embodiments of the disclosure.

Spatial relation terms, such as "under", "below", "lower", "beneath", "above", "upper", etc., are used herein for ease of description to describe the relationship between one element or feature and another element or feature as illustrated in the drawings. It should be understood that the spatial relation terms are intended to encompass different orientations of a device in use and operation, in addition to the orientation depicted in the drawings. For example, if the device in the drawings is turned over, an element or feature described as "below" or "beneath" or "under" another element would be oriented "above" the other element or feature. Thus, the exemplary terms "below" and "under" can encompass both an orientation of above and below. The device may be additionally oriented (rotated 90 degrees or at other orientations) and the spatial relation descriptors used herein are interpreted accordingly.

The terms used herein is for the purpose of describing particular embodiments only and is not intended to limit the embodiments of the disclosure. As used herein, the singular forms "a", "an" and "said/the" are intended to include the plural forms as well, unless the context clearly indicates otherwise. It should be further understood that the terms "comprises" and/or "comprising", when used in this specification, the presence of the features, integers, steps, operations, elements, and/or components is determined, but the presence or addition of one or more other features, integers, steps, operations, elements, components, and/or groups thereof is not precluded. As used herein, the term "and/or" includes any and all combinations of one or more of the associated listed items.

For thoroughly understanding the embodiments of the disclosure, detailed steps and detailed structures will be set forth in the following description to illustrate technical solutions of the disclosure. Preferred embodiments of the disclosure are described as follows in detail. However, other implementations in addition to these detailed descriptions may also be included in the embodiments of the disclosure.

In existing integrated circuits, identification and inspection of a parasitic latch-up path can ensure that an integrated circuit product may not fail due to latch-up, so that reliability of the product is ensured. However, at present, there is generally no set of reliable, effective and comprehensive method for identifying and inspecting a parasitic latch path, and this is a big challenge to the prevention of latch-up.

The method for identifying a latch-up structure provided by the embodiments of the disclosure will be described in detail below with reference to specific embodiments. FIG. 1A to FIG. 7E illustrate seven methods for identifying a latch-up structure in total. For different latch-up structures, positions of a first N-type heavily doped region, a first P-type heavily doped region, a second N-type heavily doped region and a second P-type heavily doped region thereof are arranged to different. It should be noted that in FIG. 1A to FIG. 7E, the P-type heavily doped regions are referred to as P+ for short, the N-type heavily doped regions are referred to as N+ for short, first input/output pads are referred to as IO for short, ground pads are referred to as VSS for short, and power pads are referred to as VDD for short.

FIG. 1A is a schematic flowchart of a method for identifying a latch-up structure provided in an embodiment of the disclosure. As shown in FIG. 1A, the method includes the following operations.

In 101a, in a chip layout, a first N-type heavily doped region connected to a first input/output pad and located in a P-type substrate is found.

In 102a, a first P-type heavily doped region located in an N-well and a second P-type heavily doped region located in the P-type substrate are found, both of which are adjacent to the first N-type heavily doped region.

In 103a, a second N-type heavily doped region adjacent to the first P-type heavily doped region and located in the N-well is found. The N-well is located on the P-type substrate. An area formed by the first P-type heavily doped region, the first N-type heavily doped region, the second P-type heavily doped region, the second N-type heavily doped region, the N-well and the P-type substrate is identified as the latch-up structure.

The method for identifying a latch-up structure provided by the embodiments of the disclosure is further described in detail below with reference to specific embodiments.

Figure 1B:
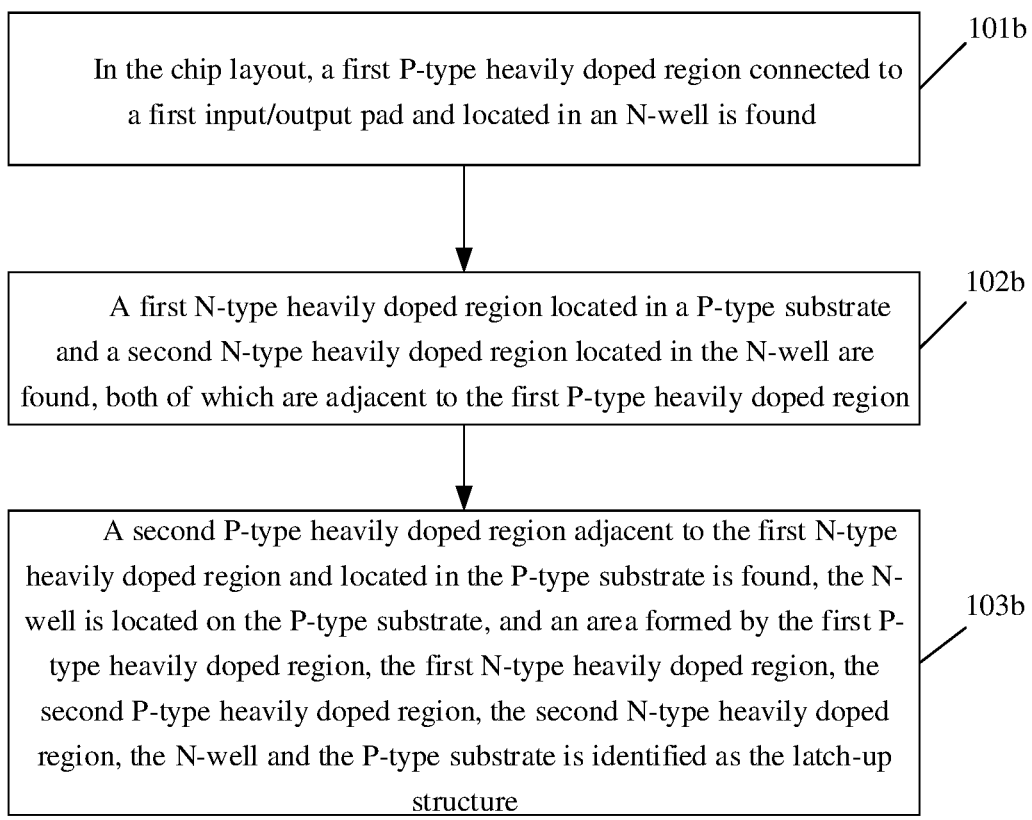
FIG. 1B is a schematic flowchart of a method for identifying a latch-up structure provided in another embodiment of the disclosure.
Figure 1C:
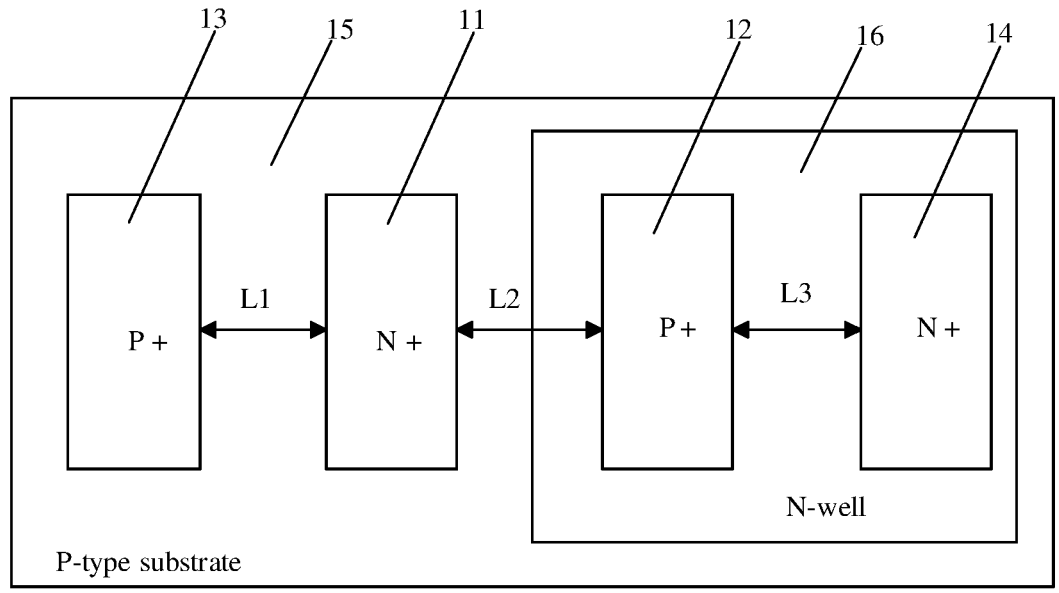
FIG. 1C is a top view of a latch-up structure provided in an embodiment of the disclosure.
Figure 1D:
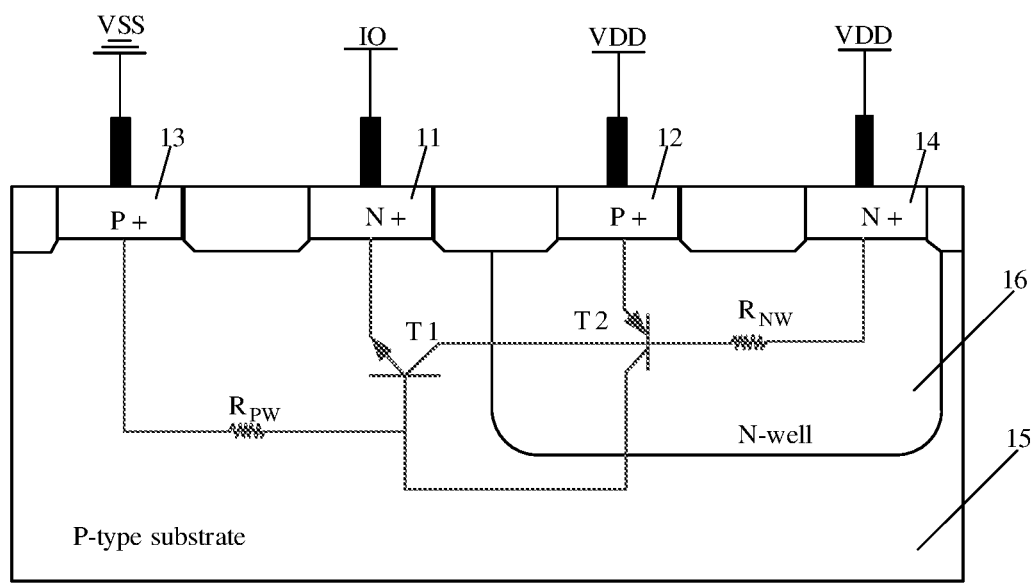
FIG. 1D is a sectional view of a latch-up structure provided in an embodiment of the disclosure.

FIG. 1C is a top view of a latch-up structure provided in an embodiment of the disclosure. FIG. 1D is a sectional view of a latch-up structure provided in an embodiment of the disclosure.

Before the operation in 101a is executed, a first input/output pad is found first. The first input/output pad includes a data signal pad (DQ PAD) or an address pad (CA PAD) or other pads.

As shown in FIG. 1D, the operation in 101a is performed. In a chip layout, a first N-type heavily doped region 11 connected to a first input/output pad and located in a P-type substrate 15 is found.

In one embodiment, the operation that the first N-type heavily doped region 11 connected to the first input/output pad and located in the P-type substrate 15 is found includes the following action.

The first N-type heavily doped region 11 directly or indirectly connected to the first input/output pad and located in the P-type substrate 15 is found.

The operation of finding the first N-type heavily doped region 11 directly connected to the first input/output pad refers to that the first input/output pad is directly connected to the first N-type heavily doped region 11 without other devices.

The operation of finding the first N-type heavily doped region 11 indirectly connected to the first input/output pad refers to that the first input/output pad may be connected to the first N-type heavily doped region 11 by means of a high current conducting path. Specifically, the first N-type heavily doped region 11 may be connected to the first input/output pad by means of, for example, a resistor having low resistance, a switching device or a diode. More specifically, the first input/output pad may be connected to the first N-type heavily doped region 11 by means of a backward diode.

Then, the operation in 102a is performed. A first P-type heavily doped region 12 located in an N-well 16 and a second P-type heavily doped region 13 located in the P-type substrate 15 are found, both of which are adjacent to the first N-type heavily doped region 11.

In the present embodiment, the first P-type heavily doped region 12 is connected to a power pad, and the second P-type heavily doped region 13 is connected to a ground pad.

The first P-type heavily doped region 12 may be directly or indirectly connected to the power pad. The indirect connection includes a connection by means of a high current conducting path. Specifically, the first P-type heavily doped region 12 may be connected to the power pad by means of, for example, a resistor having low resistance, a switching device or a diode.

The second P-type heavily doped region 13 may be directly or indirectly connected to the ground pad. The indirect connection includes a connection by means of a high current conducting path. Specifically, the second P-type heavily doped region 13 may be connected to the ground pad by means of, for example, a resistor having low resistance, a switching device or a diode.

In one embodiment, the operation that the first P-type heavily doped region 12 located in an N-well 16 and the second P-type heavily doped region 13 located in the P-type substrate 15 are found, both of which are adjacent to the first N-type heavily doped region 11 includes the following action. By taking the first N-type heavily doped region 11 as a center and a preset distance as a radius, the first P-type heavily doped region 12 and the second P-type heavily doped region 13 with the distances to the first N-type heavily doped region 11 less than the preset distance are identified. Here, the preset distance may be obtained according to design rules of the chip layout.

Then, the operation in 103a is performed. A second N-type heavily doped region 14 adjacent to the first P-type heavily doped region 12 and located in the N-well 16 is found. The N-well 16 is located on the P-type substrate 15. An area formed by the first P-type heavily doped region 12, the first N-type heavily doped region 11, the second P-type heavily doped region 13, the second N-type heavily doped region 14, the N-well 16 and the P-type substrate 15 is identified as the latch-up structure.

In the present embodiment, the second N-type heavily doped region 14 is connected to the power pad.

The second N-type heavily doped region 14 may be directly or indirectly connected to the power pad. The indirect connection includes a connection by means of a high current conducting path. Specifically, the second N-type heavily doped region 14 may be connected to the power pad by means of, for example, a resistor having low resistance, a switching device or a diode.

The operation that the second N-type heavily doped region 14 adjacent to the first P-type heavily doped region 12 and located in the N-well 16 is found includes the following action. By taking the first P-type heavily doped region 12 as a center and a preset distance as a radius, the second N-type heavily doped region 14 is identified, the distance of which to the first P-type heavily doped region 12 is less than the preset distance.

In one embodiment, as shown in FIG. 1C, there are a first distance L1 between the second P-type heavily doped region 13 and the first N-type heavily doped region 11, a second distance L2 between the first N-type heavily doped region 11 and the first P-type heavily doped region 12, and a third distance L3 between the first P-type heavily doped region 12 and the second N-type heavily doped region 14.

The operation that, by taking the first N-type heavily doped region 11 as a center and a preset distance as a radius, the first P-type heavily doped region 12 and the second P-type heavily doped region 13 with the distances to the first N-type heavily doped region 11 less than the preset distance are identified, specifically includes: the second distance and the first distance are both less than the preset distance.

FIG. 1B is a schematic flowchart of a method for identifying a latch-up structure provided in another embodiment of the disclosure. As shown in FIG. 1B, the method includes the following operations.

In 101b, in the chip layout, a first P-type heavily doped region connected to a first input/output pad and located in an N-well is found.

In 102b, a first N-type heavily doped region located in a P-type substrate and a second N-type heavily doped region located in the N-well are found, both of which are adjacent to the first P-type heavily doped region.

In 103b, a second P-type heavily doped region adjacent to the first N-type heavily doped region and located in the P-type substrate is found. The N-well is located on the P-type substrate. An area formed by the first P-type heavily doped region, the first N-type heavily doped region, the second P-type heavily doped region, the second N-type heavily doped region, the N-well and the P-type substrate is identified as the latch-up structure.

The method for identifying a latch-up structure provided by the embodiments of the disclosure is further described in detail below with reference to specific embodiments.

Figure 1E:
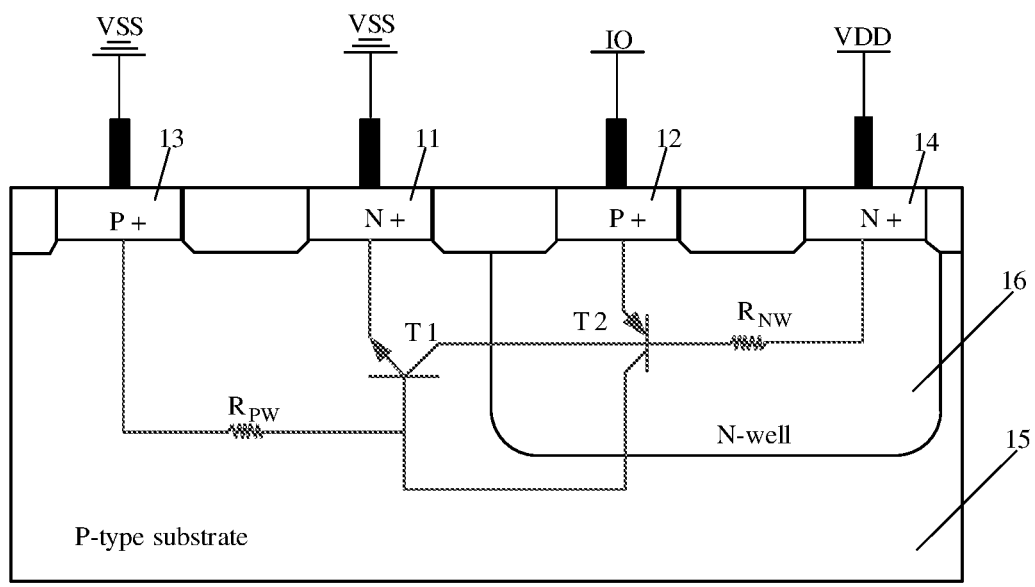
FIG. 1E is a sectional view of a latch-up structure provided in another embodiment of the disclosure.

FIG. 1E is a sectional view of a latch-up structure provided in another embodiment of the disclosure.

Before performing the operation in 101b, a first input/output pad is found first. The first input/output pad includes a data signal pad (DQ PAD) or an address pad (CA PAD) or other pads.

As shown in FIG. 1E, the operation in 101b is performed. In the chip layout, a first P-type heavily doped region 12 connected to a first input/output pad and located in an N-well 16 is found.

In one embodiment, the operation that the first P-type heavily doped region 12 connected to the first input/output pad and located in the N-well 16 is found includes following operations.

The first P-type heavily doped region 12 directly or indirectly connected to the first input/output pad and located in the N-well 16 is found.

The operation of finding the first P-type heavily doped region 12 directly connected to the first input/output pad refers to that the first input/output pad is directly connected to the first P-type heavily doped region 12 without other devices.

The operation of finding the first P-type heavily doped region 12 indirectly connected to the first input/output pad refers to that the first input/output pad may be connected to the first P-type heavily doped region 12 by means of a high current conducting path. Specifically, the first P-type heavily doped region 12 may be connected to the first input/output pad by means of, for example, a resistor having low resistance, a switching device or a diode. More specifically, the first input/output pad may be connected to the first P-type heavily doped region 12 by means of a forward diode.

Then, the operation in 102b is performed. A first N-type heavily doped region 11 located in a P-type substrate 15 and a second N-type heavily doped region 14 located in the N-well 16 are found, both of which are adjacent to the first P-type heavily doped region 12.

In the present embodiment, the first N-type heavily doped region 11 is connected to a ground pad, and the second N-type heavily doped region 14 is connected to a power pad.

The first N-type heavily doped region 11 may be directly or indirectly connected to the ground pad. The indirect connection includes a connection by means of a high current conducting path. Specifically, the first N-type heavily doped region 11 may be connected to the ground pad by means of, for example, a resistor having low resistance, a switching device or a diode.

The second N-type heavily doped region 14 may be directly or indirectly connected to the power pad. The indirect connection includes a connection by means of a high current conducting path. Specifically, the second N-type heavily doped region 14 may be connected to the power pad by means of, for example, a resistor having low resistance, a switching device or a diode.

In one embodiment, the operation that the first N-type heavily doped region 11 located in the P-type substrate 15 and the second N-type heavily doped region 14 located in the N-well 16 are found, both of which are adjacent to the first P-type heavily doped region 12 includes the following action. By taking the first P-type heavily doped region 12 as a center and a preset distance as a radius, the first N-type heavily doped region 11 and the second N-type heavily doped region 14 with the distances to the first P-type heavily doped region 12 less than the preset distance are identified.

Then, the operation in 103b is performed. A second P-type heavily doped region 13 adjacent to the first N-type heavily doped region 11 and located in the P-type substrate 15 is found. The N-well 16 is located on the P-type substrate 15. An area formed by the first P-type heavily doped region 12, the first N-type heavily doped region 11, the second P-type heavily doped region 13, the second N-type heavily doped region 14, the N-well 16 and the P-type substrate 15 is identified as the latch-up structure.

In the present embodiment, the second P-type heavily doped region 13 is connected to the ground pad.

The second P-type heavily doped region 13 may be directly or indirectly connected to the ground pad. The indirect connection includes a connection by means of a high current conducting path. Specifically, the second P-type heavily doped region 13 may be connected to the ground pad by means of, for example, a resistor having low resistance, a switching device or a diode.

In one embodiment, the operation that the second P-type heavily doped region 13 adjacent to the first N-type heavily doped region 11 and located in the P-type substrate 15 is found includes the following action. By taking the first N-type heavily doped region 11 as a center and a preset distance as a radius, the second P-type heavily doped region 13 is identified, the distance of which to the first N-type heavily doped region 11 is less than the preset distance.

In one embodiment, as shown in FIG. 1C, there are a first distance L1 between the second P-type heavily doped region 13 and the first N-type heavily doped region 11, a second distance L2 between the first N-type heavily doped region 11 and the first P-type heavily doped region 12, and a third distance L3 between the first P-type heavily doped region 12 and the second N-type heavily doped region 14.

The operation that, by taking the first P-type heavily doped region 12 as a center and a preset distance as a radius, the first N-type heavily doped region 11 and the second N-type heavily doped region 14 with the distances to the first P-type heavily doped region 12 less than the preset distance are identified specifically includes: the second distance and the third distance are both less than the preset distance.

Furthermore, as shown in FIG. 1D and FIG. 1E, the N-well 16, the P-type substrate 15 and the first N-type heavily doped region 11 form a first parasitic NPN transistor T1. The first P-type heavily doped region 12, the N-well 16 and the P-type substrate 15 form a first parasitic PNP transistor T2.

The P-type substrate 15 has a first parasitic resistor $R_{PW}$, a first end of which is connected to the second P-type heavily doped region 13 and a second end of which is connected to a base of the first parasitic NPN transistor T1.

The N-well 16 has a second parasitic resistor $R_{NW}$, a first end of which is connected to the second N-type heavily doped region 14 and a second end of which is connected to a base of the first parasitic PNP transistor T2.

The following describes the principle of a latch-up effect in the latch-up structure. Specifically, T2 is a vertical PNP transistor, the base is the N-well, and a gain from the base to a collector may reach dozens of times. T1 is a side NPN transistor, the base is the P-type substrate, and a gain from the base to the collector may reach dozens of times. $R_{NW}$ is a parasitic resistor of the N-well, and $R_{PW}$ is a parasitic resistor of the P-type substrate.

The above four elements T1, T2, $R_{NW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one of the transistors suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

Figure 2A:
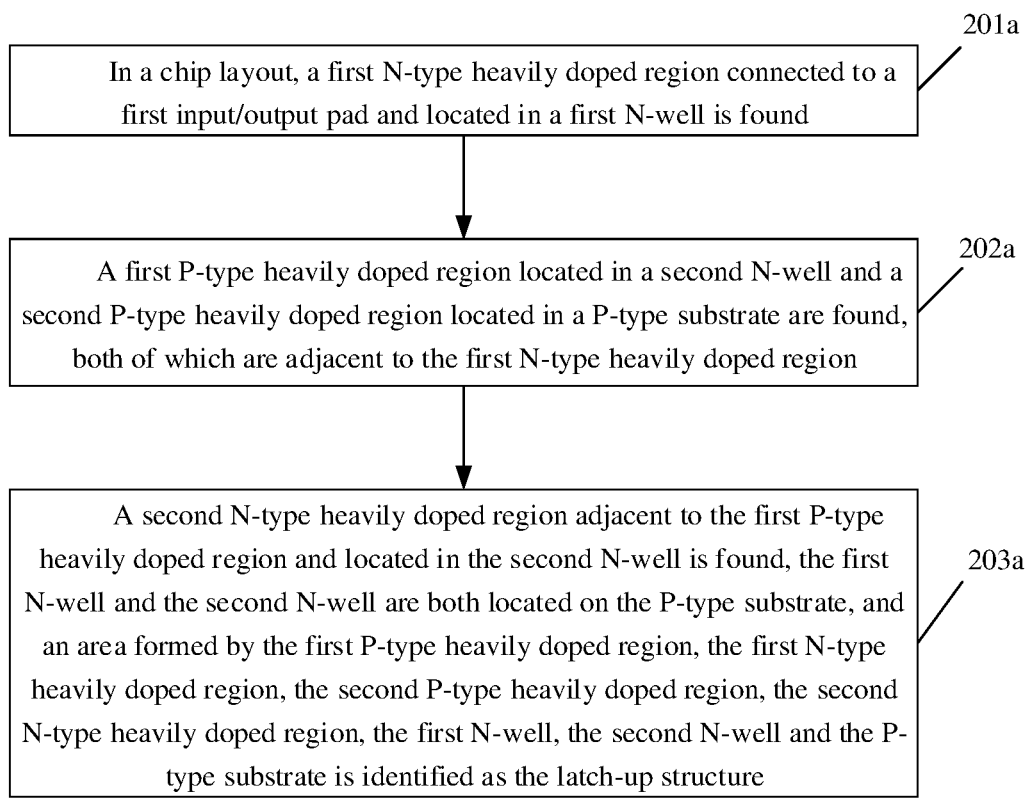
FIG. 2A is a schematic flowchart of a method for identifying a latch-up structure provided in an embodiment of the disclosure.

FIG. 2A is a schematic flowchart of a method for identifying a latch-up structure provided in an embodiment of the disclosure. As shown in FIG. 2A, the method includes the following operations.

In 201a, in a chip layout, a first N-type heavily doped region connected to a first input/output pad and located in a first N-well is found.

In 202a, a first P-type heavily doped region located in a second N-well and a second P-type heavily doped region located in a P-type substrate are found, both of which are adjacent to the first N-type heavily doped region.

In 203a, a second N-type heavily doped region adjacent to the first P-type heavily doped region and located in the second N-well is found. The first N-well and the second N-well are both located on the P-type substrate. An area formed by the first P-type heavily doped region, the first N-type heavily doped region, the second P-type heavily doped region, the second N-type heavily doped region, the first N-well, the second N-well and the P-type substrate is identified as the latch-up structure.

The method for identifying a latch-up structure provided by the embodiments of the disclosure is further described in detail below with reference to specific embodiments.

Figure 2B:
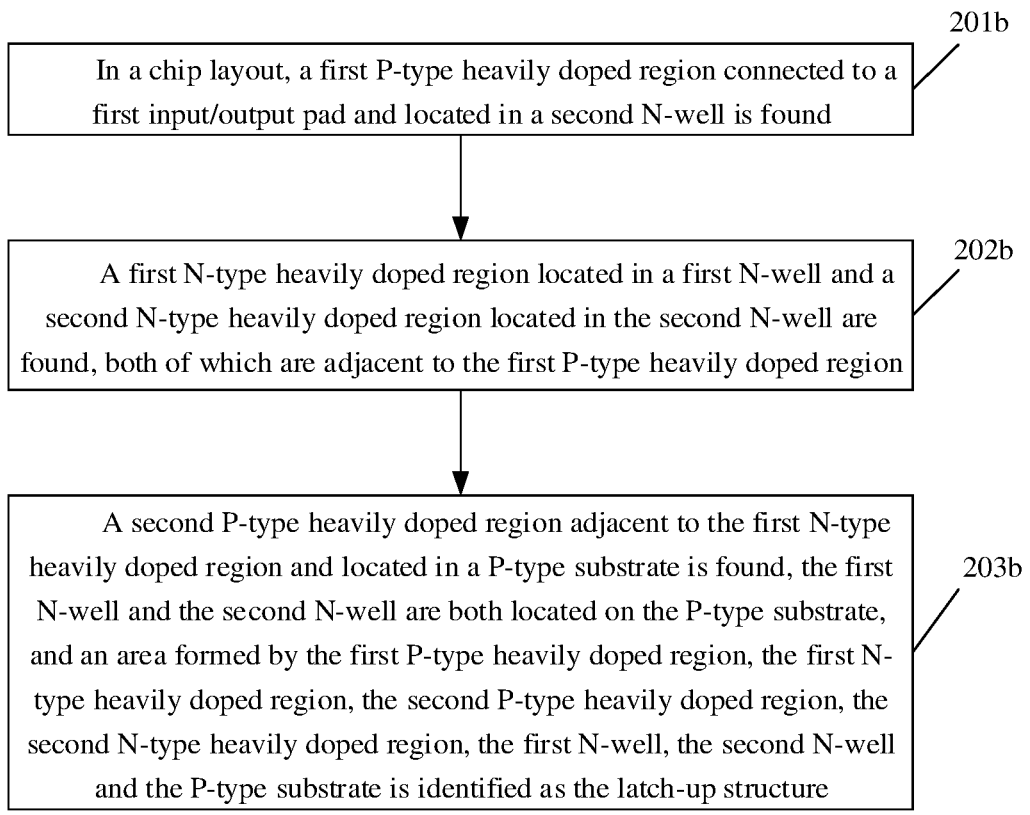
FIG. 2B is a schematic flowchart of a method for identifying a latch-up structure provided in another embodiment of the disclosure.
Figure 2C:
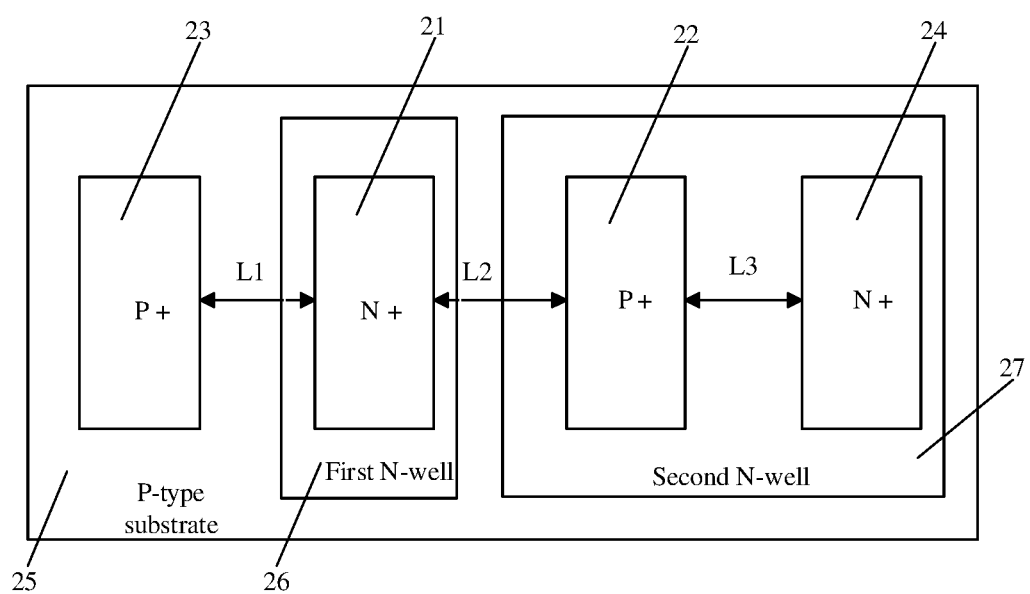
FIG. 2C is a top view of a latch-up structure provided in an embodiment of the disclosure.
Figure 2D:
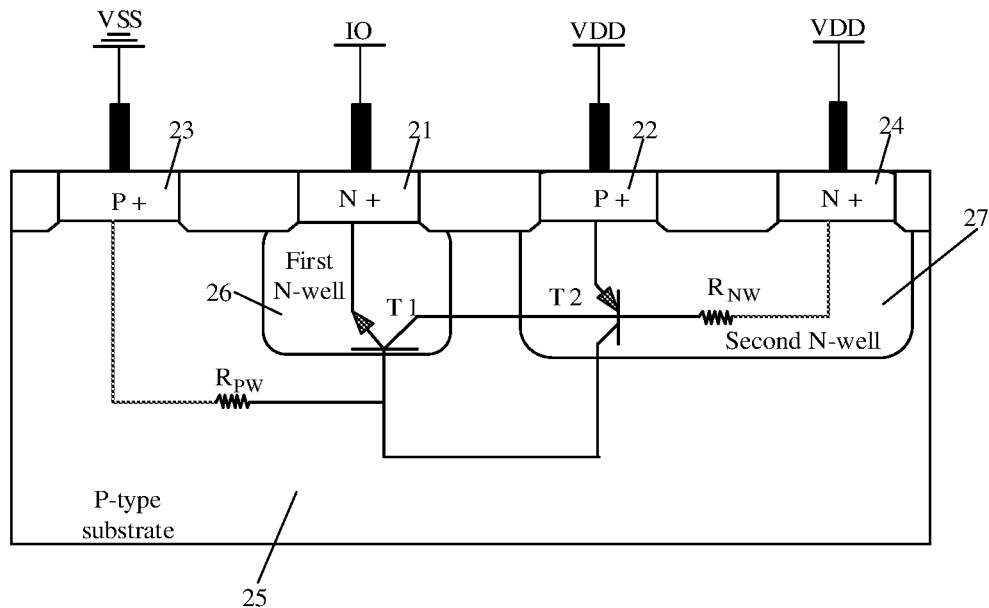
FIG. 2D is a sectional view of a latch-up structure provided in an embodiment of the disclosure.

FIG. 2C is a top view of a latch-up structure provided in an embodiment of the disclosure. FIG. 2D is a sectional view of a latch-up structure provided in an embodiment of the disclosure.

Before the operation in 201a is performed, a first input/output pad is found first. The first input/output pad includes a data signal pad (DQ PAD) or an address pad (CA PAD) or other pads.

As shown in FIG. 2D, the operation in 201a is performed. In a chip layout, a first N-type heavily doped region 21 connected to a first input/output pad and located in a first N-well 26 is found.

In one embodiment, the operation that the first N-type heavily doped region 21 connected to the first input/output pad and located in the first N-well 26 is found includes following operations.

The first N-type heavily doped region 21 directly or indirectly connected to the first input/output pad and located in the first N-well 26 is found.

The operation of finding the first N-type heavily doped region 21 directly connected to the first input/output pad refers to that the first input/output pad is directly connected to the first N-type heavily doped region 21 without other devices.

The operation of finding the first N-type heavily doped region 21 indirectly connected to the first input/output pad refers to that the first input/output pad may be connected to the first N-type heavily doped region 21 by means of a high current conducting path. Specifically, the first N-type heavily doped region 21 may be connected to the first input/output pad by means of, for example, a resistor having low resistance, a switching device or a diode. More specifically, the first input/output pad may be connected to the first N-type heavily doped region 21 by means of a backward diode.

Then, the operation in 202a is performed. A first P-type heavily doped region 22 located in a second N-well 27 and a second P-type heavily doped region 23 located in a P-type substrate 25 are found, both of which are adjacent to the first N-type heavily doped region 21.

In the present embodiment, the first P-type heavily doped region 22 is connected to a power pad, and the second P-type heavily doped region 23 is connected to a ground pad.

The first P-type heavily doped region 22 may be directly or indirectly connected to the power pad. The indirect connection includes a connection by means of a high current conducting path. Specifically, the first P-type heavily doped region 22 may be connected to the power pad by means of, for example, a resistor having low resistance, a switching device or a diode.

The second P-type heavily doped region 23 may be directly or indirectly connected to the ground pad. The indirect connection includes a connection by means of a high current conducting path. Specifically, the second P-type heavily doped region 23 may be connected to the ground pad by means of, for example, a resistor having low resistance, a switching device or a diode.

In one embodiment, the operation that the first P-type heavily doped region 22 located in the second N-well 27 and the second P-type heavily doped region 23 located in the P-type substrate 25 are found, both of which are adjacent to the first N-type heavily doped region 21 includes the following action. By taking the first N-type heavily doped region 21 as a center and a preset distance as a radius, the first P-type heavily doped region 22 and the second P-type heavily doped region 23 are identified, the distances of which to the first N-type heavily doped region 21 are less than the preset distance.

Then, the operation in 203a is performed. A second N-type heavily doped region 24 adjacent to the first P-type heavily doped region 22 and located in the second N-well 27 is found. The first N-well 26 and the second N-well 27 are both located on the P-type substrate 25. An area formed by the first P-type heavily doped region 22, the first N-type heavily doped region 21, the second P-type heavily doped region 23, the second N-type heavily doped region 24, the first N-well 26, the second N-well 27 and the P-type substrate 25 is identified as the latch-up structure.

In the present embodiment, the second N-type heavily doped region 24 is connected to the power pad.

The second N-type heavily doped region 24 may be directly or indirectly connected to the power pad. The indirect connection includes a connection by means of a high current conducting path. Specifically, the second N-type heavily doped region 24 may be connected to the power pad by means of, for example, a resistor having low resistance, a switching device or a diode.

The operation that the second N-type heavily doped region 24 adjacent to the first P-type heavily doped region 22 and located in the second N-well 27 is found includes the following action. By taking the first P-type heavily doped region 22 as a center and a preset distance as a radius, the second N-type heavily doped region 24 is identified, the distance of which to the first P-type heavily doped region 22 is less than the preset distance.

In one embodiment, as shown in FIG. 2C, there are a first distance L1 between the second P-type heavily doped region 23 and the first N-type heavily doped region 21, a second distance L2 between the first N-type heavily doped region 21 and the first P-type heavily doped region 22, and a third distance L3 between the first P-type heavily doped region 22 and the second N-type heavily doped region 24.

The operation that, by taking the first N-type heavily doped region 21 as a center and a preset distance as a radius, the first P-type heavily doped region 22 and the second P-type heavily doped region 23 with the distances to the first N-type heavily doped region 21 less than the preset distance are identified specifically includes: the second distance and the first distance are both less than the preset distance.

FIG. 2B is a schematic flowchart of a method for identifying a latch-up structure provided in another embodiment of the disclosure. As shown in FIG. 2B, the method includes the following operations.

In 201b, in the chip layout, a first P-type heavily doped region connected to a first input/output pad and located in a second N-well is found.

In 202b, a first N-type heavily doped region located in a first N-well and a second N-type heavily doped region located in the second N-well are found, both of which are adjacent to the first P-type heavily doped region.

In 203b, a second P-type heavily doped region adjacent to the first N-type heavily doped region and located in a P-type substrate is found. The first N-well and the second N-well are both located on the P-type substrate. An area formed by the first P-type heavily doped region, the first N-type heavily doped region, the second P-type heavily doped region, the second N-type heavily doped region, the first N-well, the second N-well and the P-type substrate is identified as the latch-up structure.

The method for identifying a latch-up structure provided by the embodiments of the disclosure is further described in detail below with reference to specific embodiments.

Figure 2E:
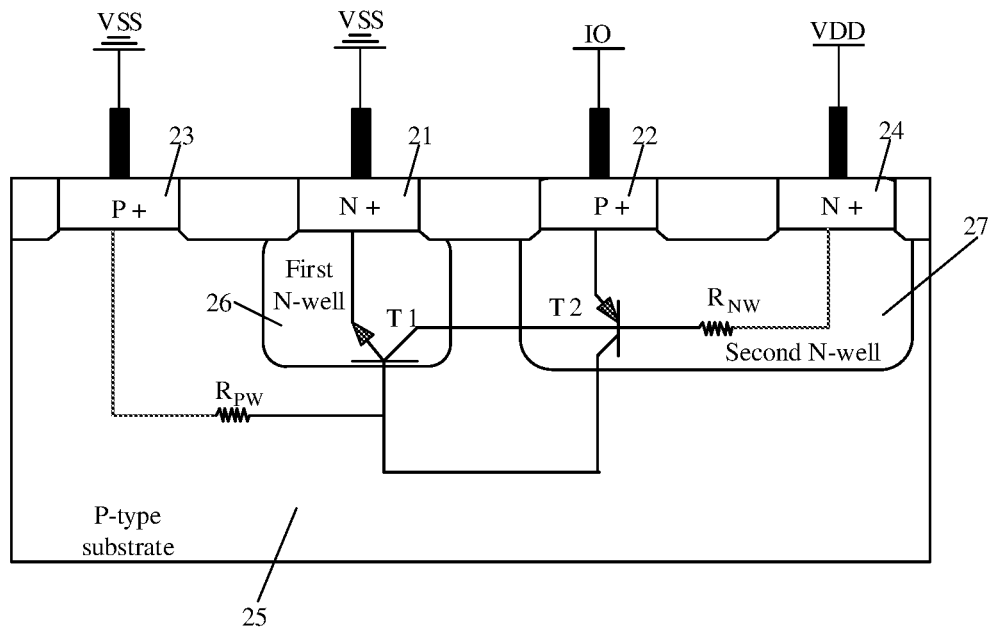
FIG. 2E is a sectional view of a latch-up structure provided in another embodiment of the disclosure.

FIG. 2E is a sectional view of a latch-up structure provided in another embodiment of the disclosure.

Before the operation in 201b performed, a first input/output pad is found first. The first input/output pad includes a data signal pad (DQ PAD) or an address pad (CA PAD) or other pads.

As shown in FIG. 2E, the operation in 201b is performed. In the chip layout, a first P-type heavily doped region 22 connected to a first input/output pad and located in a second N-well 27 is found.

In one embodiment, the operation that the first P-type heavily doped region 22 connected to the first input/output pad and located in the second N-well 27 is found includes the following action.

The first P-type heavily doped region 22 directly or indirectly connected to the first input/output pad and located in the second N-well 27 is found.

The operation of finding the first P-type heavily doped region 22 directly connected to the first input/output pad refers to that the first input/output pad is directly connected to the first P-type heavily doped region 22 without other devices.

The operation of finding the first P-type heavily doped region 22 indirectly connected to the first input/output pad refers to that the first input/output pad may be connected to the first P-type heavily doped region 22 by means of a high current conducting path. Specifically, the first P-type heavily doped region 22 may be connected to the first input/output pad by means of, for example, a resistor having low resistance, a switching device or a diode. More specifically, the first input/output pad may be connected to the first P-type heavily doped region 22 by means of a forward diode.

Then, the operation in 202b is performed. A first N-type heavily doped region 21 located in a first N-well 26 and a second N-type heavily doped region 24 located in the second N-well 27 are found, both of which are adjacent to the first P-type heavily doped region 22.

In the present embodiment, the first N-type heavily doped region 21 is connected to a ground pad, and the second N-type heavily doped region 24 is connected to a power pad.

The first N-type heavily doped region 21 may be directly or indirectly connected to the ground pad. The indirect connection includes a connection by means of a high current conducting path. Specifically, the first N-type heavily doped region 21 may be connected to the ground pad by means of, for example, a resistor having low resistance, a switching device or a diode.

The second N-type heavily doped region 24 may be directly or indirectly connected to the power pad. The indirect connection includes a connection by means of a high current conducting path. Specifically, the second N-type heavily doped region 24 may be connected to the power pad by means of, for example, a resistor having low resistance, a switching device or a diode.

In one embodiment, the operation that the first N-type heavily doped region 21 located in the first N-well 26 and the second N-type heavily doped region 24 located in the second N-well are found 27, both of which are adjacent to the first P-type heavily doped region 22, are found includes the following action. By taking the first P-type heavily doped region 22 as a center and a preset distance as a radius, the first N-type heavily doped region 21 and the second N-type heavily doped region 24 are identified, the distances of which to the first P-type heavily doped region 22 are less than the preset distance.

Then, the operation in 203b is performed. A second P-type heavily doped region 23 adjacent to the first N-type heavily doped region 21 and located in a P-type substrate 25 is found. The first N-well 26 and the second N-well 27 are both located on the P-type substrate 25. An area formed by the first P-type heavily doped region 22, the first N-type heavily doped region 21, the second P-type heavily doped region 23, the second N-type heavily doped region 24, the first N-well 26, the second N-well 27 and the P-type substrate 25 is identified as the latch-up structure.

In the present embodiment, the second P-type heavily doped region 23 is connected to the ground pad.

The second P-type heavily doped region 23 may be directly or indirectly connected to the ground pad. The indirect connection includes a connection by means of a high current conducting path. Specifically, the second P-type heavily doped region 23 may be connected to the ground pad by means of, for example, a resistor having low resistance, a switching device or a diode.

In one embodiment, the operation that the second P-type heavily doped region 23 adjacent to the first N-type heavily doped region 21 and located in the P-type substrate 25 is found includes the following action. By taking the first N-type heavily doped region 21 as a center and a preset distance as a radius, the second P-type heavily doped region 23 is identified, the distance of which to the first N-type heavily doped region 21 is less than the preset distance.

In one embodiment, as shown in FIG. 2C, there are a first distance L1 between the second P-type heavily doped region 23 and the first N-type heavily doped region 21, a second distance L2 between the first N-type heavily doped region 21 and the first P-type heavily doped region 22, and a third distance L3 between the first P-type heavily doped region 22 and the second N-type heavily doped region 24.

The operation that by taking the first P-type heavily doped region 22 as a center and a preset distance as a radius, the first N-type heavily doped region 21 and the second N-type heavily doped region 24, the distances of which to the first P-type heavily doped region 22 are less than the preset distance, are identified specifically includes: the second distance and the third distance are both less than the preset distance.

Furthermore, as shown in FIG. 2D and FIG. 2E, the second N-well 27, the P-type substrate 25 and the first N-type heavily doped region 21 form a first parasitic NPN transistor T1. The first P-type heavily doped region 22, the second N-well 27 and the P-type substrate 25 form a first parasitic PNP transistor T2.

The P-type substrate 25 has a first parasitic resistor $R_{PW}$, a first end of which is connected to the second P-type heavily doped region 23 and a second end of which is connected to a base of the first parasitic NPN transistor T1.

The second N-well 27 has a second parasitic resistor $R_{NW}$, a first end of which is connected to the second N-type heavily doped region 24 and a second end of which is connected to a base of the first parasitic PNP transistor T2.

The following describes the principle of a latch-up effect in the latch-up structure. Specifically, T2 is a vertical PNP transistor, the base is the N-well, and a gain from the base to a collector may reach dozens of times. T1 is a side NPN transistor, the base is the P-type substrate, and a gain to the collector may reach dozens of times. $R_{NW}$ is a parasitic resistor of the second N-well, and $R_{PW}$ is a parasitic resistor of the P-type substrate.

The above four elements T1, T2, $R_{NW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one of the transistors suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

Figure 3A:
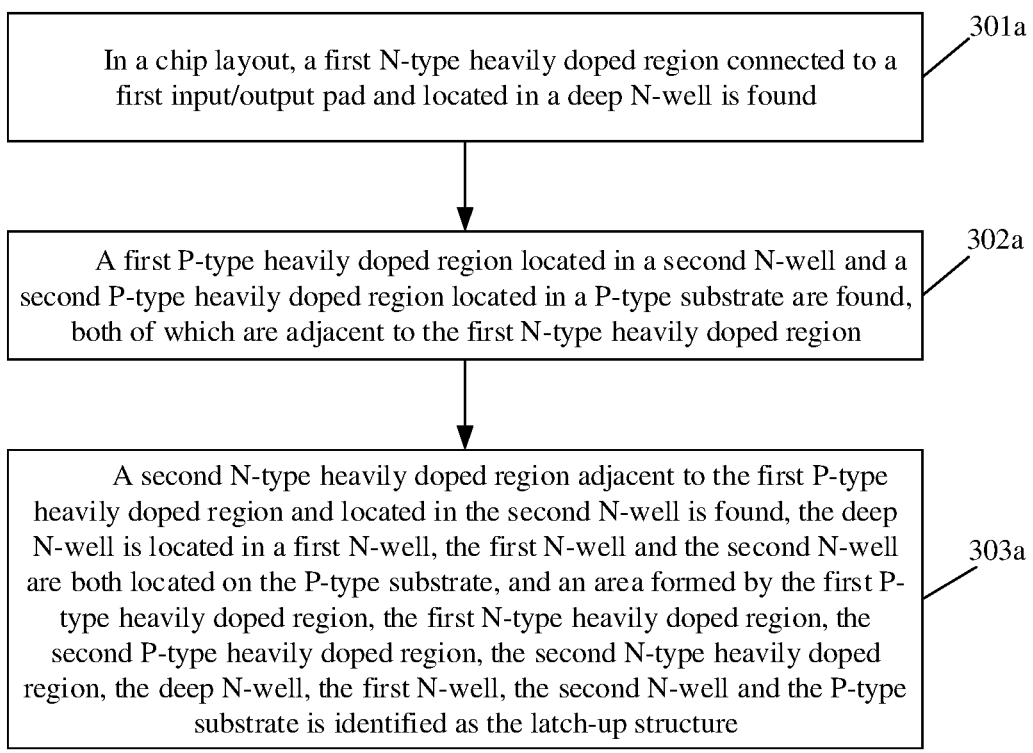
FIG. 3A is a schematic flowchart of a method for identifying a latch-up structure provided in an embodiment of the disclosure.

FIG. 3A is a schematic flowchart of a method for identifying a latch-up structure provided in an embodiment of the disclosure. As shown in FIG. 3A, the method includes the following operations.

In 301a, in a chip layout, a first N-type heavily doped region connected to a first input/output pad and located in a deep N-well is found.

In 302a, a first P-type heavily doped region located in a second N-well and a second P-type heavily doped region located in a P-type substrate are found, both of which are adjacent to the first N-type heavily doped region.

In 303a, a second N-type heavily doped region adjacent to the first P-type heavily doped region and located in the second N-well is found. The deep N-well is located in a first N-well, and the first N-well and the second N-well are both located on the P-type substrate. An area formed by the first P-type heavily doped region, the first N-type heavily doped region, the second P-type heavily doped region, the second N-type heavily doped region, the deep N-well, the first N-well, the second N-well and the P-type substrate is identified as the latch-up structure.

The method for identifying a latch-up structure provided by the embodiments of the disclosure is further described in detail below with reference to specific embodiments.

Figure 3B:
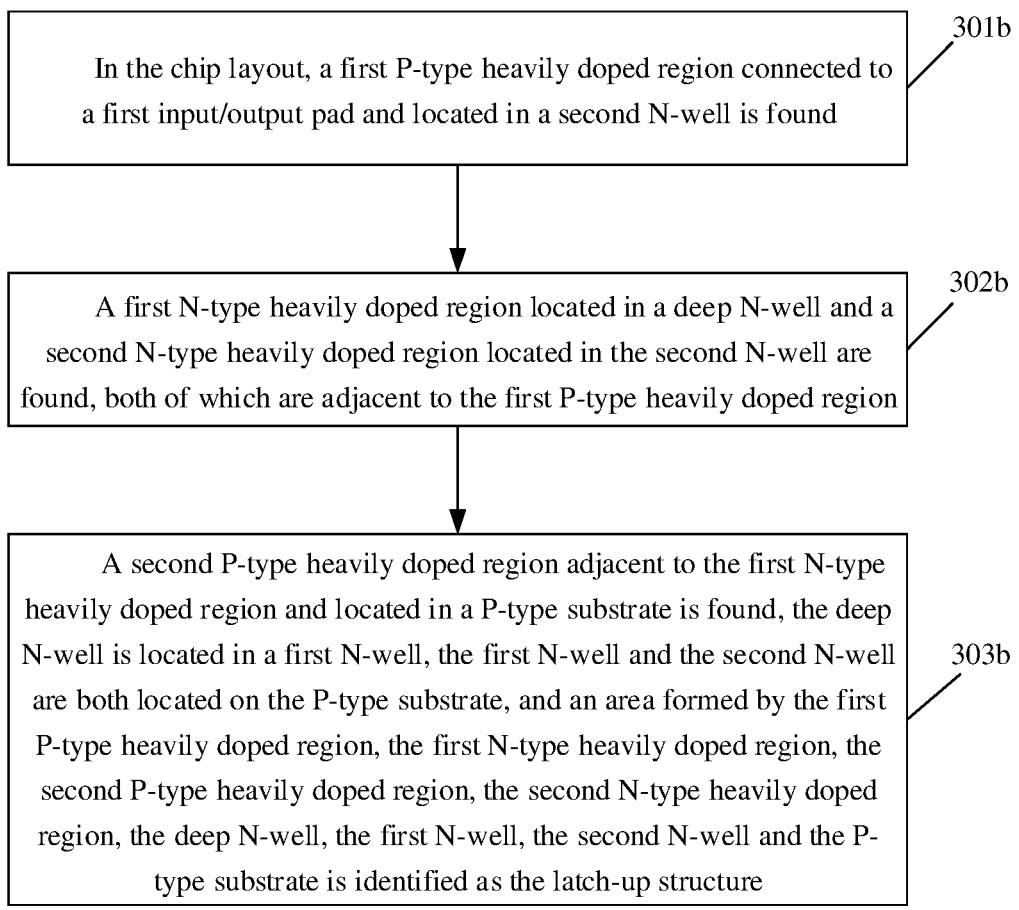
FIG. 3B is a schematic flowchart of a method for identifying a latch-up structure provided in another embodiment of the disclosure.
Figure 3C:
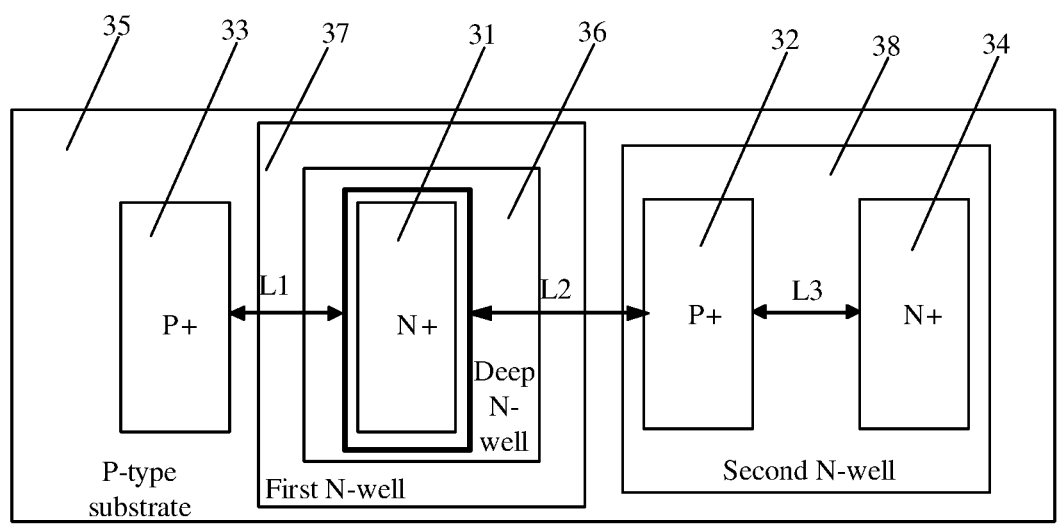
FIG. 3C is a top view of a latch-up structure provided in an embodiment of the disclosure.
Figure 3D:
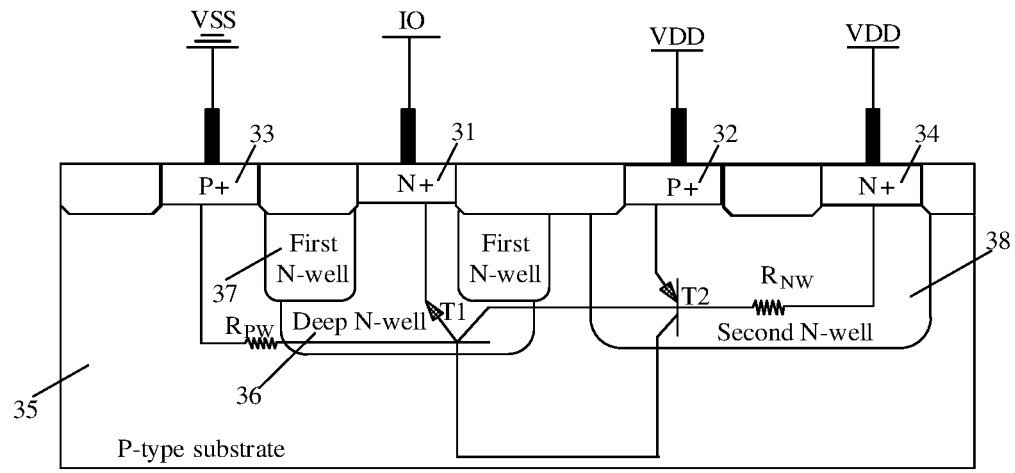
FIG. 3D is a sectional view of a latch-up structure provided in an embodiment of the disclosure.

FIG. 3C is a top view of a latch-up structure provided in an embodiment of the disclosure. FIG. 3D is a sectional view of a latch-up structure provided in an embodiment of the disclosure.

Before the operation in 301a is executed, a first input/output pad is found first. The first input/output pad includes a data signal pad (DQ PAD) or an address pad (CA PAD) or other pads.

As shown in FIG. 3D, the operation in 301a is performed. In a chip layout, a first N-type heavily doped region 31 connected to a first input/output pad and located in a deep N-well 36 is found.

In one embodiment, the operation that the first N-type heavily doped region 31 connected to the first input/output pad and located in the deep N-well 36 is found includes the following action.

The first N-type heavily doped region 31 directly or indirectly connected to the first input/output pad and located in the deep N-well 36 is found.

The operation of finding the first N-type heavily doped region 31 directly connected to the first input/output pad refers to that the first input/output pad is directly connected to the first N-type heavily doped region 31 without other devices.

The operation of finding the first N-type heavily doped region 31 indirectly connected to the first input/output pad refers to that the first input/output pad may be connected to the first N-type heavily doped region 31 by means of a high current conducting path. Specifically, the first N-type heavily doped region 31 may be connected to the first input/output pad by means of, for example, a resistor having low resistance, a switching device or a diode. More specifically, the first input/output pad may be connected to the first N-type heavily doped region 31 by means of a backward diode.

Then, the operation in 302a is performed. A first P-type heavily doped region 32 located in a second N-well 38 and a second P-type heavily doped region 33 located in a P-type substrate 35 are found, both of which are adjacent to the first N-type heavily doped region 31.

In the present embodiment, the first P-type heavily doped region 32 is connected to a power pad, and the second P-type heavily doped region 33 is connected to a ground pad.

The first P-type heavily doped region 32 may be directly or indirectly connected to the power pad. The indirect connection includes a connection by means of a high current conducting path. Specifically, the first P-type heavily doped region 32 may be connected to the power pad by means of, for example, a resistor having low resistance, a switching device or a diode.

The second P-type heavily doped region 33 may be directly or indirectly connected to the ground pad. The indirect connection includes a connection by means of a high current conducting path. Specifically, the second P-type heavily doped region 33 may be connected to the ground pad by means of, for example, a resistor having low resistance, a switching device or a diode.

In one embodiment, the operation that the first P-type heavily doped region 32 located in the second N-well 38 and the second P-type heavily doped region 33 located in the P-type substrate 35, both of which are adjacent to the first N-type heavily doped region 31, are found includes the following action. By taking the first N-type heavily doped region 31 as a center and a preset distance as a radius, the first P-type heavily doped region 32 and the second P-type heavily doped region 33 are identified, the distances of which to the first N-type heavily doped region 31 are less than the preset distance.

Then, the operation in 303a is performed. A second N-type heavily doped region 34 adjacent to the first P-type heavily doped region 32 and located in the second N-well 38 is found. The deep N-well 36 is located in a first N-well 37, and the first N-well 37 and the second N-well 38 are both located on the P-type substrate 35. An area formed by the first P-type heavily doped region 32, the first N-type heavily doped region 31, the second P-type heavily doped region 33, the second N-type heavily doped region 34, the deep N-well 36, the first N-well 37, the second N-well 38 and the P-type substrate 35 is identified as the latch-up structure.

In the present embodiment, the second N-type heavily doped region 34 is connected to the power pad.

The second N-type heavily doped region 34 may be directly or indirectly connected to the power pad. The indirect connection includes a connection by means of a high current conducting path. Specifically, the second N-type heavily doped region 34 may be connected to the power pad by means of, for example, a resistor having low resistance, a switching device or a diode.

The operation that the second N-type heavily doped region 34 adjacent to the first P-type heavily doped region 32 and located in the second N-well 38 is found includes the following action. By taking the first P-type heavily doped region 32 as a center and a preset distance as a radius, the second N-type heavily doped region 34 is identified, the distance of which to the first P-type heavily doped region 32 is less than the preset distance.

In one embodiment, as shown in FIG. 3C, there are a first distance L1 between the second P-type heavily doped region 33 and the first N-type heavily doped region 31, a second distance L2 between the first N-type heavily doped region 31 and the first P-type heavily doped region 32, and a third distance L3 between the first P-type heavily doped region 32 and the second N-type heavily doped region 34.

The operation that by taking the first N-type heavily doped region 31 as a center and a preset distance as a radius, the first P-type heavily doped region 32 and the second P-type heavily doped region 33, the distances of which to the first N-type heavily doped region 31 are less than the preset distance, are identified specifically includes: the second distance and the first distance are both less than the preset distance.

FIG. 3B is a schematic flowchart of a method for identifying a latch-up structure provided in an embodiment of the disclosure. As shown in FIG. 3B, the method includes the following the operations.

In 301b, in the chip layout, a first P-type heavily doped region connected to a first input/output pad and located in a second N-well is found.

In 302b, a first N-type heavily doped region located in a deep N-well and a second N-type heavily doped region located in the second N-well are found, both of which are adjacent to the first P-type heavily doped region.

In 303b, a second P-type heavily doped region adjacent to the first N-type heavily doped region and located in a P-type substrate is found. The deep N-well is located in a first N-well, and the first N-well and the second N-well are both located on the P-type substrate. An area formed by the first P-type heavily doped region, the first N-type heavily doped region, the second P-type heavily doped region, the second N-type heavily doped region, the deep N-well, the first N-well, the second N-well and the P-type substrate is identified as the latch-up structure.

Figure 3E:
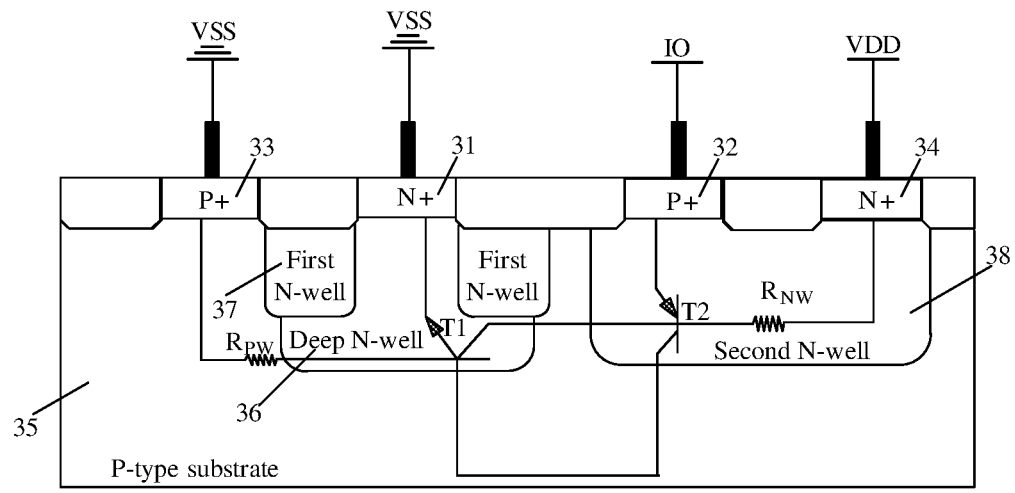
FIG. 3E is a sectional view of a latch-up structure provided in another embodiment of the disclosure.

FIG. 3E is a sectional view of a latch-up structure provided in another embodiment of the disclosure.

Before the operation in 301b is executed, a first input/output pad is found first. The first input/output pad includes a data signal pad (DQ PAD) or an address pad (CA PAD) or other pads.

As shown in FIG. 3E, the operation in 301b is performed. In the chip layout, a first P-type heavily doped region 32 connected to a first input/output pad and located in a second N-well 38 is found.

In one embodiment, the operation that the first P-type heavily doped region 32 connected to the first input/output pad and located in the second N-well 38 is found includes the following action.

The first P-type heavily doped region 32 directly or indirectly connected to the first input/output pad and located in the second N-well 38 is found.

The operation of finding the first P-type heavily doped region 32 directly connected to the first input/output pad refers to that the first input/output pad is directly connected to the first P-type heavily doped region 32 without other devices.

The operation of finding the first P-type heavily doped region 32 indirectly connected to the first input/output pad refers to that the first input/output pad may be connected to the first P-type heavily doped region 32 by means of a high current conducting path. Specifically, the first P-type heavily doped region 32 may be connected to the first input/output pad by means of, for example, a resistor having low resistance, a switching device or a diode. More specifically, the first input/output pad may be connected to the first P-type heavily doped region 32 by means of a forward diode.

Then, the operation in 302b is performed. A first N-type heavily doped region 31 located in a deep N-well 36 and a second N-type heavily doped region 34 located in the second N-well 38 are found, both of which are adjacent to the first P-type heavily doped region 32

In the present embodiment, the first N-type heavily doped region 31 is connected to a ground pad, and the second N-type heavily doped region 34 is connected to a power pad.

The first N-type heavily doped region 31 may be directly or indirectly connected to the ground pad. The indirect connection includes a connection by means of a high current conducting path. Specifically, the first N-type heavily doped region 31 may be connected to the ground pad by means of, for example, a resistor having low resistance, a switching device or a diode.

The second N-type heavily doped region 34 may be directly or indirectly connected to the power pad. The indirect connection includes a connection by means of a high current conducting path. Specifically, the second N-type heavily doped region 34 may be connected to the power pad by means of, for example, a resistor having low resistance, a switching device or a diode.

In one embodiment, the operation that the first N-type heavily doped region 31 located in the deep N-well 36 and the second N-type heavily doped region 34 located in the second N-well 38, both of which are adjacent to the first P-type heavily doped region 32, are found includes the following action. By taking the first P-type heavily doped region 32 as a center and a preset distance as a radius, the first N-type heavily doped region 31 and the second N-type heavily doped region 34 are identified, the distances of which to the first P-type heavily doped region 32 are less than the preset distance.

Then, the operation in 303b is performed. A second P-type heavily doped region 33 adjacent to the first N-type heavily doped region 31 and located in a P-type substrate 35 is found. The deep N-well 36 is located in a first N-well 37, and the first N-well 37 and the second N-well 38 are both located on the P-type substrate 35. An area formed by the first P-type heavily doped region 32, the first N-type heavily doped region 31, the second P-type heavily doped region 33, the second N-type heavily doped region 34, the deep N-well 36, the first N-well 37, the second N-well 38 and the P-type substrate 35 is identified as the latch-up structure.

In the present embodiment, the second P-type heavily doped region 33 is connected to the ground pad.

The second P-type heavily doped region 33 may be directly or indirectly connected to the ground pad. The indirect connection includes a connection by means of a high current conducting path. Specifically, the second P-type heavily doped region 33 may be connected to the ground pad by means of, for example, a resistor having low resistance, a switching device or a diode.

In one embodiment, the operation that the second P-type heavily doped region 33 adjacent to the first N-type heavily doped region 31 and located in the P-type substrate 35 is found includes the following action. By taking the first N-type heavily doped region 31 as a center and a preset distance as a radius, the second P-type heavily doped region 33 is identified, the distance of which to the first N-type heavily doped region 31 is less than the preset distance.

In one embodiment, as shown in FIG. 3C, there are a first distance L1 between the second P-type heavily doped region 33 and the first N-type heavily doped region 31, a second distance L2 between the first N-type heavily doped region 31 and the first P-type heavily doped region 32, and a third distance L3 between the first P-type heavily doped region 32 and the second N-type heavily doped region 34.

The operation that, by taking the first P-type heavily doped region 32 as a center and a preset distance as a radius, the first N-type heavily doped region 31 and the second N-type heavily doped region 34, the distances of which to the first P-type heavily doped region 32 are less than the preset distance, are identified specifically includes: the second distance and the third distance are both less than the preset distance.

Furthermore, as shown in FIG. 3D and FIG. 3E, the second N-well 38, the P-type substrate 35 and the deep N-well 36 form a first parasitic NPN transistor T1. The first P-type heavily doped region 32, the second N-well 38 and the P-type substrate 35 form a first parasitic PNP transistor T2.

The P-type substrate 35 has a first parasitic resistor $R_{PW}$. The first parasitic resistor $R_{PW}$ has a first end connected to the second P-type heavily doped region 33 and a second end connected to an emitter of the first parasitic NPN transistor T1.

The second N-well 38 has a second parasitic resistor $R_{NW}$. The second parasitic resistor $R_{NW}$ has a first end connected to the second N-type heavily doped region 34 and a second end connected to a base of the first parasitic PNP transistor T2.

The following describes the principle of a latch-up effect in the latch-up structure. Specifically, T2 is a vertical PNP transistor, the base is the N-well, and a gain from the base to a collector may reach dozens of times. T1 is a side NPN transistor, the base is the P-type substrate, and a gain to the collector may reach dozens of times. $R_{NW}$ is a parasitic resistor of the second N-well, and $R_{PW}$ is a parasitic resistor of the P-type substrate.

The above four elements T1, T2, $R_{NW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one of the transistors suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

Figure 4A:
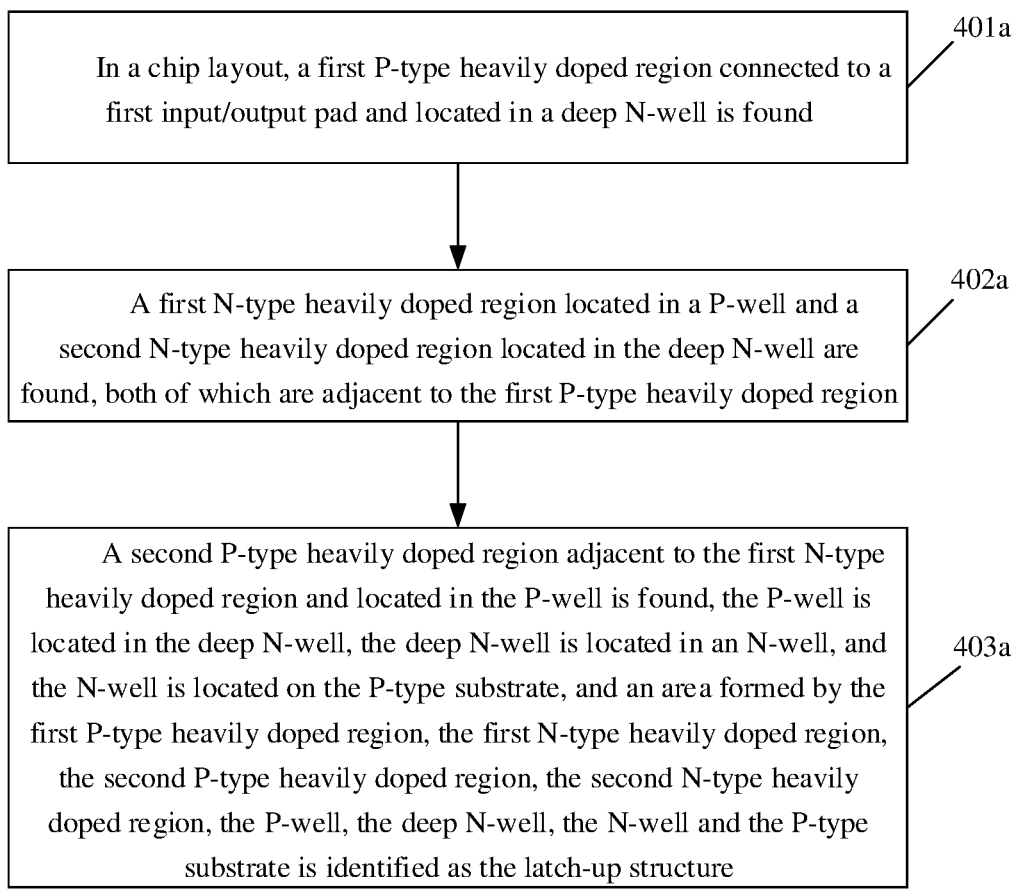
FIG. 4A is a schematic flowchart of a method for identifying a latch-up structure provided in an embodiment of the disclosure.

FIG. 4A is a schematic flowchart of a method for identifying a latch-up structure provided in an embodiment of the disclosure. As shown in FIG. 4A, the method includes the following the operations.

In 401a, in a chip layout, a first P-type heavily doped region connected to a first input/output pad and located in a deep N-well is found.

In 402a, a first N-type heavily doped region located in a P-well and a second N-type heavily doped region located in the deep N-well are found, both of which are adjacent to the first P-type heavily doped region.

In 403a, a second P-type heavily doped region adjacent to the first N-type heavily doped region and located in the P-well is found. The P-well is located in the deep N-well, the deep N-well is located in an N-well, and the N-well is located on the P-type substrate. An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

The method for identifying a latch-up structure provided by the embodiments of the disclosure is further described in detail below with reference to specific embodiments.

Figure 4B:
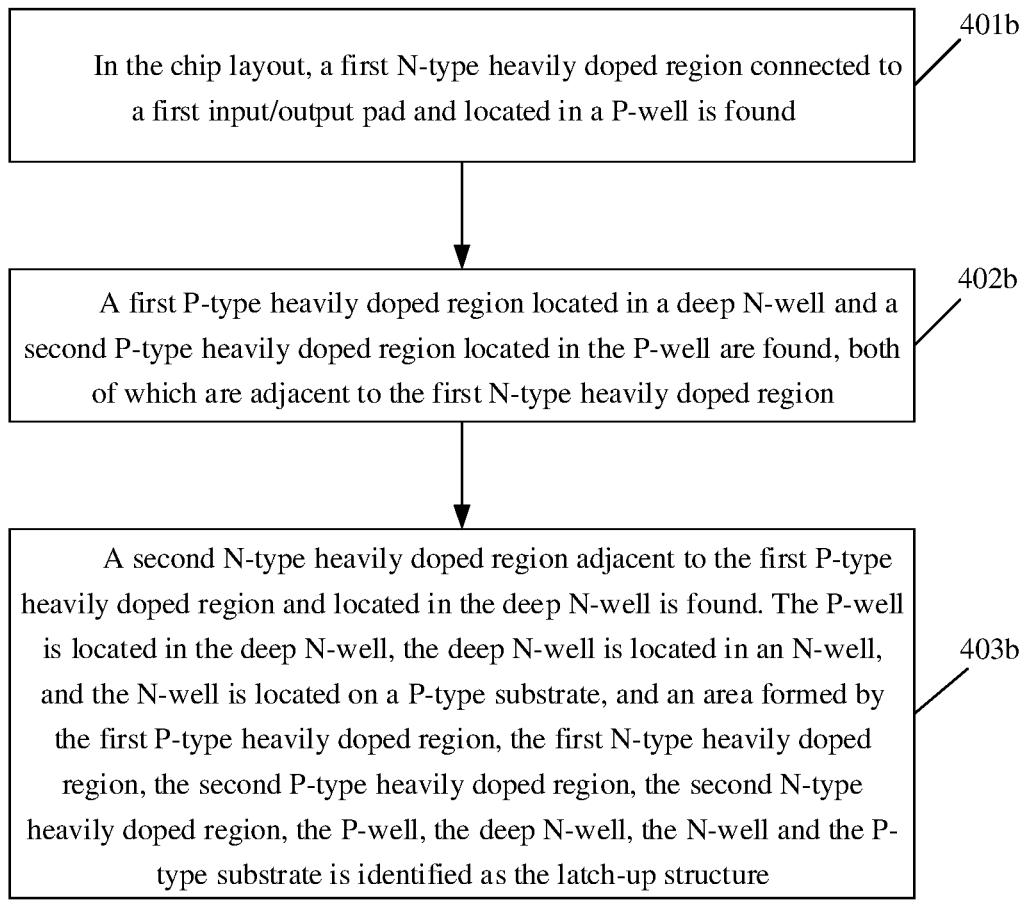
FIG. 4B is a schematic flowchart of a method for identifying a latch-up structure provided in another embodiment of the disclosure.
Figure 4C:
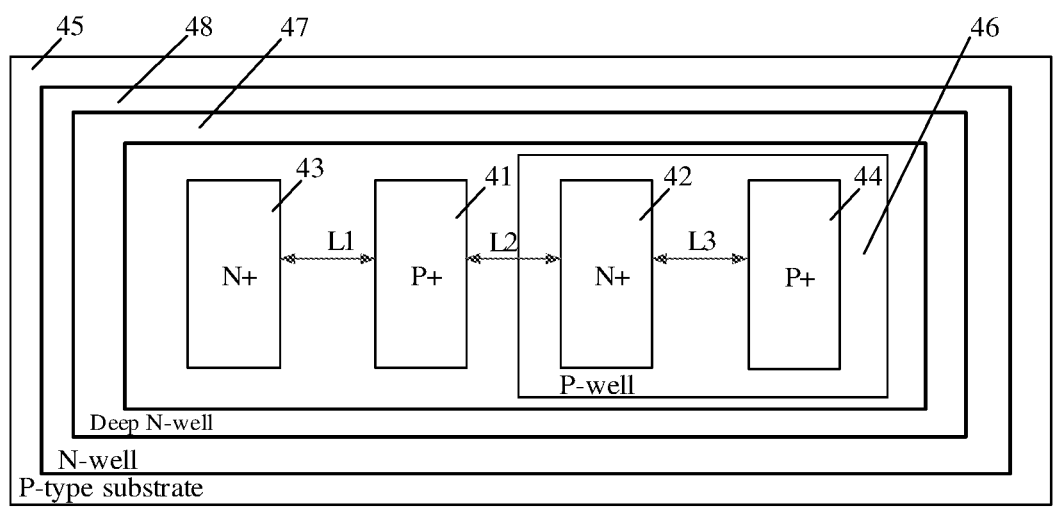
FIG. 4C is a top view of a latch-up structure provided in an embodiment of the disclosure.
Figure 4D:
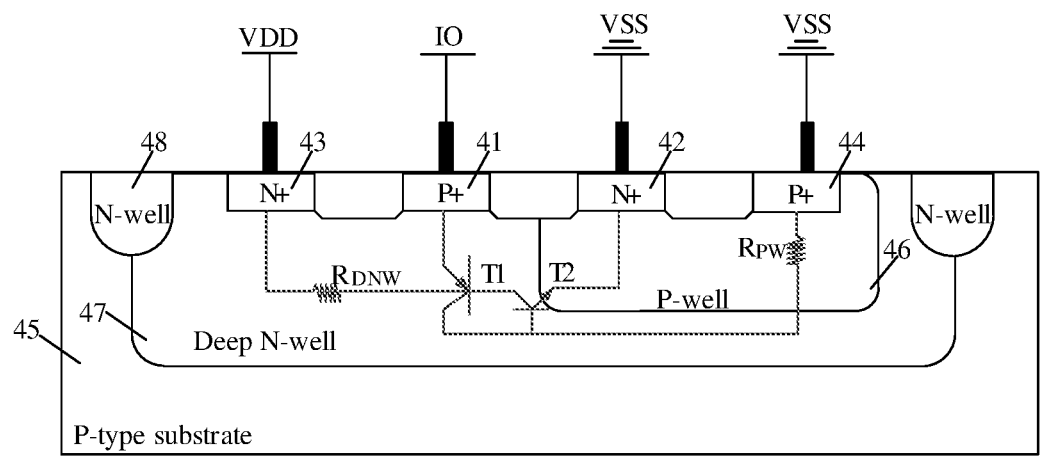
FIG. 4D is a sectional view of a latch-up structure provided in an embodiment of the disclosure.

FIG. 4C is a top view of a latch-up structure provided in an embodiment of the disclosure. FIG. 4D is a sectional view of a latch-up structure provided in an embodiment of the disclosure.

Before the operation in 401a is executed, a first input/output pad is found first. The first input/output pad includes a data signal pad (DQ PAD) or an address pad (CA PAD) or other pads.

As shown in FIG. 4D, the operation in 401a is performed. In a chip layout, a first P-type heavily doped region 41 connected to a first input/output pad and located in a deep N-well 47 is found.

In one embodiment, the operation that the first P-type heavily doped region 41 connected to the first input/output pad and located in the deep N-well 47 is found includes following action.

The first P-type heavily doped region 41 directly or indirectly connected to the first input/output pad and located in the deep N-well 47 is found.

The operation of finding the first P-type heavily doped region 41 directly connected to the first input/output pad refers to that the first input/output pad is directly connected to the first P-type heavily doped region 41 without other devices.

The operation of finding the first P-type heavily doped region 41 indirectly connected to the first input/output pad refers to that the first input/output pad may be connected to the first P-type heavily doped region 41 by means of a high current conducting path. Specifically, the first P-type heavily doped region 41 may be connected to the first input/output pad by means of, for example, a resistor having low resistance, a switching device or a diode. More specifically, the first input/output pad may be connected to the first P-type heavily doped region 41 by means of a forward diode.

Then, the operation in 402a is performed. A first N-type heavily doped region 42 located in a P-well 46 and a second N-type heavily doped region 43 located in the deep N-well 47, both of which are adjacent to the first P-type heavily doped region 41, are found.

In the present embodiment, the first N-type heavily doped region 42 is connected to a ground pad, and the second N-type heavily doped region 43 is connected to a power pad.

The first N-type heavily doped region 42 may be directly or indirectly connected to the ground pad. The indirect connection includes a connection by means of a high current conducting path. Specifically, the first N-type heavily doped region 42 may be connected to the ground pad by means of, for example, a resistor having low resistance, a switching device or a diode.

The second N-type heavily doped region 43 may be directly or indirectly connected to the power pad. The indirect connection includes a connection by means of a high current conducting path. Specifically, the second N-type heavily doped region 43 may be connected to the power pad by means of, for example, a resistor having low resistance, a switching device or a diode.

In one embodiment, the operation that the first N-type heavily doped region 42 located in the P-well 46 and the second N-type heavily doped region 43 located in the deep N-well 47, both of which are adjacent to the first P-type heavily doped region 41, are found includes the following action. By taking the first P-type heavily doped region 41 as a center and a preset distance as a radius, the first N-type heavily doped region 42 and the second N-type heavily doped region 43 are identified, the distances of which to the first P-type heavily doped region 41 are less than the preset distance.

Then, the operation in 403a is performed. A second P-type heavily doped region 44 adjacent to the first N-type heavily doped region 42 and located in the P-well 46 is found. The P-well 46 is located in the deep N-well 47, the deep N-well 47 is located in an N-well 48, and the N-well 48 is located on the P-type substrate 45. An area formed by the first P-type heavily doped region 41, the first N-type heavily doped region 42, the second P-type heavily doped region 44, the second N-type heavily doped region 43, the P-well 46, the deep N-well 47, the N-well 48 and the P-type substrate 45 is identified as the latch-up structure.

In the present embodiment, the second P-type heavily doped region 44 is connected to the ground pad.

The second P-type heavily doped region 44 may be directly or indirectly connected to the ground pad. The indirect connection includes a connection by means of a high current conducting path. Specifically, the second P-type heavily doped region 44 may be connected to the ground pad by means of, for example, a resistor having low resistance, a switching device or a diode.

The operation that the second P-type heavily doped region 44 adjacent to the first N-type heavily doped region 42 and located in the P-well 46 is found includes following action. By taking the first N-type heavily doped region 42 as a center and a preset distance as a radius, the second P-type heavily doped region 44 with the distance to the first N-type heavily doped region 42 less than the preset distance is identified.

In one embodiment, as shown in FIG. 4C, there are a first distance L1 between the second N-type heavily doped region 43 and the first P-type heavily doped region 41, a second distance L2 between the first P-type heavily doped region 41 and the first N-type heavily doped region 42, and a third distance L3 between the first N-type heavily doped region 42 and the second P-type heavily doped region 44.

The operation that, by taking the first P-type heavily doped region 41 as a center and a preset distance as a radius, the first N-type heavily doped region 42 and the second N-type heavily doped region 43, the distances of which to the first P-type heavily doped region 41 are less than the preset distance, are identified specifically includes: the second distance and the first distance are both less than the preset distance.

FIG. 4B is a schematic flowchart of a method for identifying a latch-up structure provided in an embodiment of the disclosure. As shown in FIG. 4B, the method includes the following the operations.

In 401b, in the chip layout, a first N-type heavily doped region connected to a first input/output pad and located in a P-well is found.

In 402b, a first P-type heavily doped region located in a deep N-well and a second P-type heavily doped region located in the P-well are found, both of which are adjacent to the first N-type heavily doped region.

In 403b, a second N-type heavily doped region adjacent to the first P-type heavily doped region and located in the deep N-well is found. The P-well is located in the deep N-well, the deep N-well is located in an N-well, and the N-well is located on a P-type substrate. An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

The method for identifying a latch-up structure provided by the embodiments of the disclosure is further described in detail below with reference to specific embodiments.

Figure 4E:
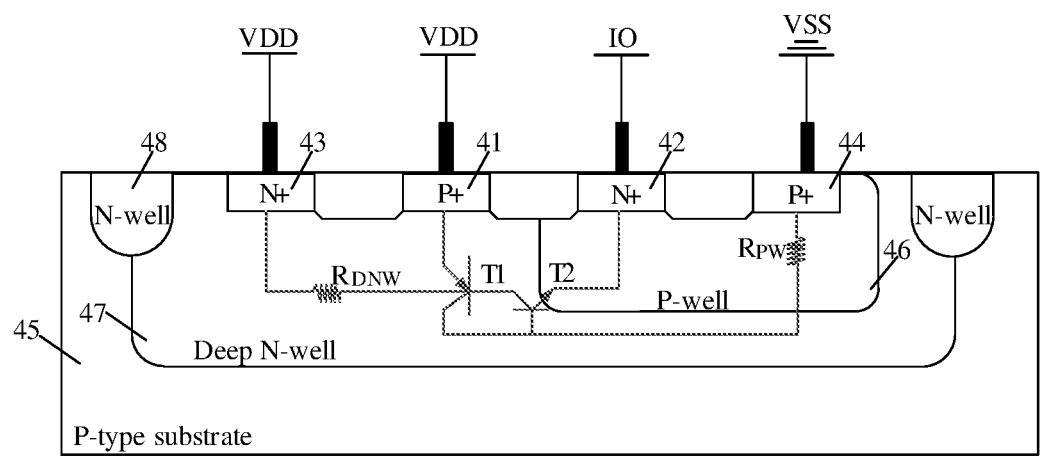
FIG. 4E is a sectional view of a latch-up structure provided in another embodiment of the disclosure.

FIG. 4E is a sectional view of a latch-up structure provided in another embodiment of the disclosure.

Before the operation in 401b is executed, a first input/output pad is found first. The first input/output pad includes a data signal pad (DQ PAD) or an address pad (CA PAD) or other pads.

As shown in FIG. 4E, the operation in 401b is performed. In the chip layout, a first N-type heavily doped region 42 connected to a first input/output pad and located in a P-well 46 is found.

In one embodiment, the operation that the first N-type heavily doped region 42 connected to the first input/output pad and located in the P-well 46 is found includes the following action.

The first N-type heavily doped region 42 directly or indirectly connected to the first input/output pad and located in the P-well 46 is found.

The operation of finding the first N-type heavily doped region 42 directly connected to the first input/output pad refers to that the first input/output pad is directly connected to the first N-type heavily doped region 42 without other devices.

The operation of finding the first N-type heavily doped region 42 indirectly connected to the first input/output pad refers to that the first input/output pad may be connected to the first N-type heavily doped region 42 by means of a high current conducting path. Specifically, the first N-type heavily doped region 42 may be connected to the first input/output pad by means of, for example, a resistor having low resistance, a switching device or a diode. More specifically, the first input/output pad may be connected to the first N-type heavily doped region 42 by means of a backward diode.

Then, the operation in 402b is performed. A first P-type heavily doped region 41 located in a deep N-well 47 and a second P-type heavily doped region 44 located in the P-well 46 are found, both of which are adjacent to the first N-type heavily doped region 42.

In the present embodiment, the first P-type heavily doped region 41 is connected to a power pad, and the second P-type heavily doped region 44 is connected to a ground pad.

The first P-type heavily doped region 41 may be directly or indirectly connected to the power pad. The indirect connection includes a connection by means of a high current conducting path. Specifically, the first P-type heavily doped region 41 may be connected to the power pad by means of, for example, a resistor having low resistance, a switching device or a diode.

The second P-type heavily doped region 44 may be directly or indirectly connected to the ground pad. The indirect connection includes a connection by means of a high current conducting path. Specifically, the second P-type heavily doped region 44 may be connected to the ground pad by means of, for example, a resistor having low resistance, a switching device or a diode.

In one embodiment, the operation that the first P-type heavily doped region 41 located in the deep N-well 47 and the second P-type heavily doped region 44 located in the P-well 46, both of which are adjacent to the first N-type heavily doped region 42, are found includes the following action. By taking the first N-type heavily doped region 42 as a center and a preset distance as a radius, the first P-type heavily doped region 41 and the second P-type heavily doped region 44 are identified, the distances of which to the first N-type heavily doped region 42 are less than the preset distance.

Then, the operation in 403b is performed. A second N-type heavily doped region 43 adjacent to the first P-type heavily doped region 41 and located in the deep N-well 47 is found. The P-well 46 is located in the deep N-well 47, the deep N-well 47 is located in an N-well 48, and the N-well 48 is located on a P-type substrate 45. An area formed by the first P-type heavily doped region 41, the first N-type heavily doped region 42, the second P-type heavily doped region 44, the second N-type heavily doped region 43, the P-well 46, the deep N-well 47, the N-well 48 and the P-type substrate 45 is identified as the latch-up structure.

In the present embodiment, the second N-type heavily doped region 43 is connected to the power pad.

The second N-type heavily doped region 43 may be directly or indirectly connected to the power pad. The indirect connection includes a connection by means of a high current conducting path. Specifically, the second N-type heavily doped region 43 may be connected to the power pad by means of, for example, a resistor having low resistance, a switching device or a diode.

In one embodiment, the operation that the second N-type heavily doped region 43 adjacent to the first P-type heavily doped region 41 and located in the deep N-well 47 is found includes following action. By taking the first P-type heavily doped region 41 as a center and a preset distance as a radius, the second N-type heavily doped region 43 is identified, the distance of which to the first P-type heavily doped region 41 is less than the preset distance.

In one embodiment, as shown in FIG. 4C, there are a first distance L1 between the second N-type heavily doped region 43 and the first P-type heavily doped region 41, a second distance L2 between the first P-type heavily doped region 41 and the first N-type heavily doped region 42, and a third distance L3 between the first N-type heavily doped region 42 and the second P-type heavily doped region 44.

The operation that, by taking the first N-type heavily doped region 42 as a center and a preset distance as a radius, the first P-type heavily doped region 41 and the second P-type heavily doped region 44, the distances of which to the first N-type heavily doped region 42 are less than the preset distance, are identified specifically includes: the second distance and the third distance are both less than the preset distance.

Furthermore, as shown in FIG. 4D and FIG. 4E, the first P-type heavily doped region 41, the deep N-well 47 and the second P-type heavily doped region 44 form a first parasitic PNP transistor T1. The first N-type heavily doped region 42, the P-well 46 and the deep N-well 47 form a first parasitic NPN transistor T2.

The deep N-well 47 has a first parasitic resistor $R_{DNW}$. The first parasitic resistor $R_{DNW}$ has a first end connected to the second N-type heavily doped region 43 and a second end connected to a base of the first parasitic PNP transistor.

The P-well 46 has a second parasitic resistor $R_{PW}$. The second parasitic resistor $R_{PW}$ has a first end connected to the second P-type heavily doped region 44 and a second end connected to a base of the first parasitic NPN transistor T2 and a collector of the first parasitic PNP transistor T1.

The following describes the principle of a latch-up effect. Specifically, T1 is a vertical PNP transistor, the base is the N-well, and a gain from the base to a collector may reach hundreds of times. T2 is a side NPN transistor, the base is the P-type substrate, and a gain to the collector may reach dozens of times. $R_{DNW}$ is a parasitic resistor of the deep N-well, and $R_{PW}$ is a parasitic resistor of the P-well.

The above four elements T1, T2, $R_{DNW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one of the transistors suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

Figure 5A:
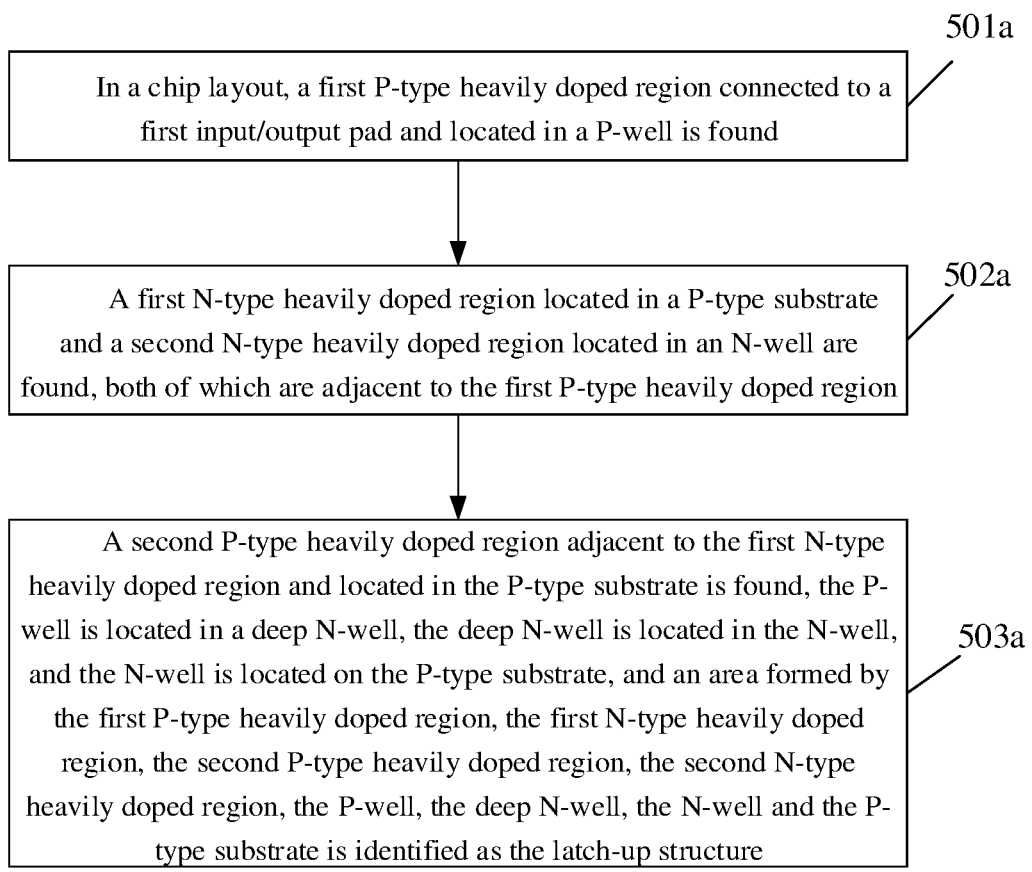
FIG. 5A is a schematic flowchart of a method for identifying a latch-up structure provided in an embodiment of the disclosure.

FIG. 5A is a schematic flowchart of a method for identifying a latch-up structure provided in an embodiment of the disclosure. As shown in FIG. 5A, the method includes the following the operations.

In 501a, in a chip layout, a first P-type heavily doped region connected to a first input/output pad and located in a P-well is found.

In 502a, a first N-type heavily doped region located in a P-type substrate and a second N-type heavily doped region located in an N-well are found, both of which are adjacent to the first P-type heavily doped region.

In 503a, a second P-type heavily doped region adjacent to the first N-type heavily doped region and located in the P-type substrate is found. The P-well is located in a deep N-well, the deep N-well is located in the N-well, and the N-well is located on the P-type substrate. An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

The method for identifying a latch-up structure provided by the embodiments of the disclosure is further described in detail below with reference to specific embodiments.

Figure 5B:
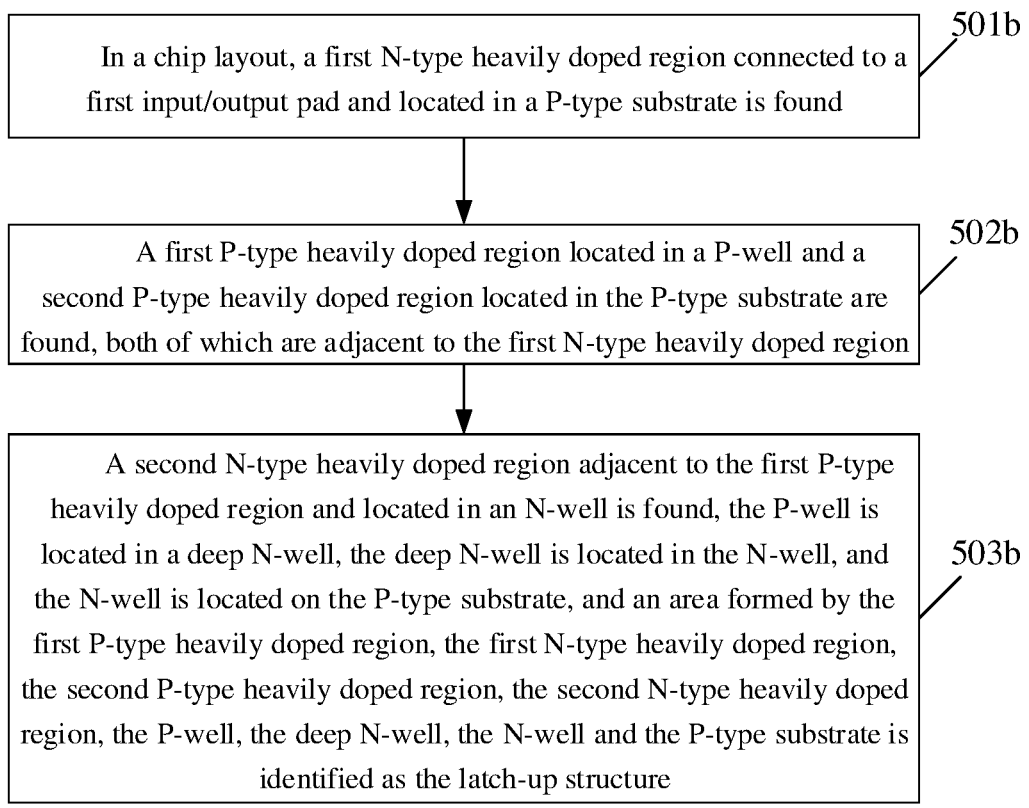
FIG. 5B is a schematic flowchart of a method for identifying a latch-up structure provided in another embodiment of the disclosure.
Figure 5C:
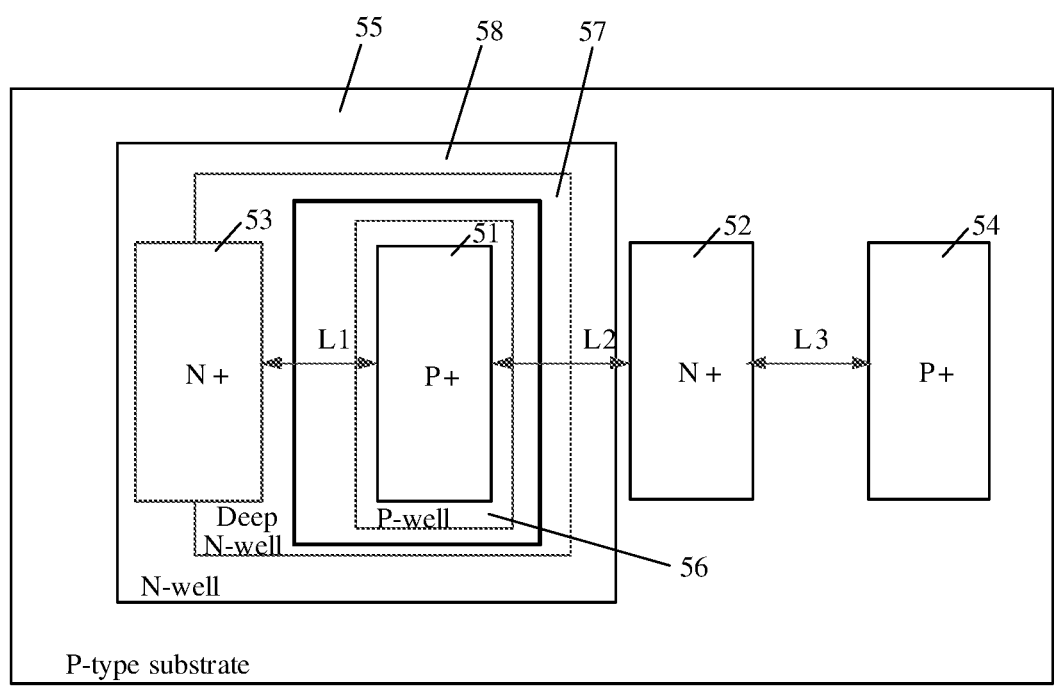
FIG. 5C is a top view of a latch-up structure provided in an embodiment of the disclosure.
Figure 5D:
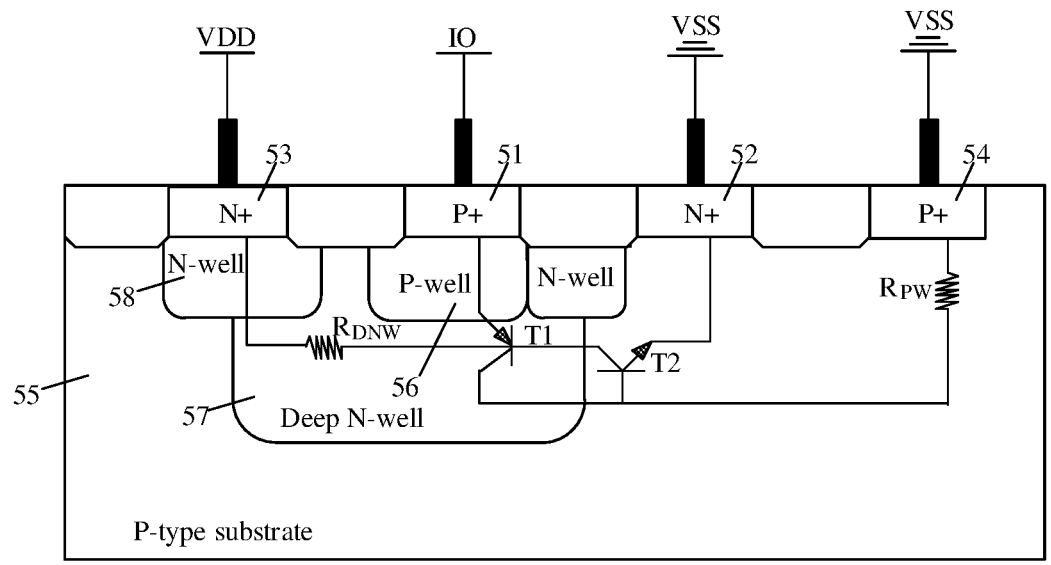
FIG. 5D is a sectional view of a latch-up structure provided in an embodiment of the disclosure.

FIG. 5C is a top view of a latch-up structure provided in an embodiment of the disclosure. FIG. 5D is a sectional view of a latch-up structure provided in an embodiment of the disclosure.

Before the operation in 501a is executed, a first input/output pad is found first. The first input/output pad includes a data signal pad (DQ PAD) or an address pad (CA PAD) or other pads.

As shown in FIG. 5D, the operation in 501a is performed. In a chip layout, a first P-type heavily doped region 51 connected to a first input/output pad and located in a P-well 56 is found.

In one embodiment, the operation that the first P-type heavily doped region 51 connected to the first input/output pad and located in the P-well 56 is found includes the following action.

The first P-type heavily doped region 51 directly or indirectly connected to the first input/output pad and located in the P-well 56 is found.

The operation of finding the first P-type heavily doped region 51 directly connected to the first input/output pad refers to that the first input/output pad is directly connected to the first P-type heavily doped region 51 without other devices.

The operation of finding the first P-type heavily doped region 51 indirectly connected to the first input/output pad refers to that the first input/output pad may be connected to the first P-type heavily doped region 51 by means of a high current conducting path. Specifically, the first P-type heavily doped region 51 may be connected to the first input/output pad by means of, for example, a resistor having low resistance, a switching device or a diode. More specifically, the first input/output pad may be connected to the first P-type heavily doped region 51 by means of a forward diode.

Then, the operation in 502a is performed. A first N-type heavily doped region 52 located in a P-type substrate 55 and a second N-type heavily doped region 53 located in an N-well 58 are found, both of which are adjacent to the first P-type heavily doped region 51.

In the present embodiment, the first N-type heavily doped region 52 is connected to a ground pad, and the second N-type heavily doped region 53 is connected to a power pad.

The first N-type heavily doped region 52 may be directly or indirectly connected to the ground pad. The indirect connection includes a connection by means of a high current conducting path. Specifically, the first N-type heavily doped region 52 may be connected to the ground pad by means of, for example, a resistor having low resistance, a switching device or a diode.

The second N-type heavily doped region 53 may be directly or indirectly connected to the power pad. The indirect connection includes a connection by means of a high current conducting path. Specifically, the second N-type heavily doped region 53 may be connected to the power pad by means of, for example, a resistor having low resistance, a switching device or a diode.

In one embodiment, the operation that the first N-type heavily doped region 52 located in the P-type substrate 55 and the second N-type heavily doped region 53 located in the N-well 58, both of which are adjacent to the first P-type heavily doped region 51, are found includes the following action. By taking the first P-type heavily doped region 51 as a center and a preset distance as a radius, the first N-type heavily doped region 52 and the second N-type heavily doped region 53 are identified, the distances of which to the first P-type heavily doped region 51 are less than the preset distance.

Then, the operation in 503a is performed. A second P-type heavily doped region 54 adjacent to the first N-type heavily doped region 52 and located in the P-type substrate 55 is found. The P-well 56 is located in a deep N-well 57, the deep N-well 57 is located in the N-well 58, and the N-well 58 is located on the P-type substrate 55. An area formed by the first P-type heavily doped region 51, the first N-type heavily doped region 52, the second P-type heavily doped region 54, the second N-type heavily doped region 53, the P-well 56, the deep N-well 57, the N-well 58 and the P-type substrate 55 is identified as the latch-up structure.

In the present embodiment, the second P-type heavily doped region 54 is connected to the ground pad.

The second P-type heavily doped region 54 may be directly or indirectly connected to the ground pad. The indirect connection includes a connection by means of a high current conducting path. Specifically, the second P-type heavily doped region 54 may be connected to the ground pad by means of, for example, a resistor having low resistance, a switching device or a diode.

The operation that the second P-type heavily doped region 54 adjacent to the first N-type heavily doped region 52 and located in the P-type substrate 55 is found includes the following action. By taking the first N-type heavily doped region 52 as a center and a preset distance as a radius, the second P-type heavily doped region 54 is identified, the distance of which to the first N-type heavily doped region 52 is less than the preset distance.

In one embodiment, as shown in FIG. 5C, there are a first distance L1 between the second N-type heavily doped region 53 and the first P-type heavily doped region 51, a second distance L2 between the first P-type heavily doped region 51 and the first N-type heavily doped region 52, and a third distance L3 between the first N-type heavily doped region 52 and the second P-type heavily doped region 54.

The operation that, by taking the first P-type heavily doped region 51 as a center and a preset distance as a radius, the first N-type heavily doped region 52 and the second N-type heavily doped region 53, the distances of which to the first P-type heavily doped region 51 are less than the preset distance, are identified specifically includes: the second distance and the first distance are both less than the preset distance.

FIG. 5B is a schematic flowchart of a method for identifying a latch-up structure provided in another embodiment of the disclosure. As shown in FIG. 5B, the method includes the following the operations.

In 501b, in the chip layout, a first N-type heavily doped region connected to a first input/output pad and located in a P-type substrate is found.

In 502b, a first P-type heavily doped region located in a P-well and a second P-type heavily doped region located in the P-type substrate are found, both of which are adjacent to the first N-type heavily doped region.

In 503b, a second N-type heavily doped region adjacent to the first P-type heavily doped region and located in an N-well is found. The P-well is located in a deep N-well, the deep N-well is located in the N-well, and the N-well is located on the P-type substrate. An area formed by the first P-type heavily doped region, the first N-type heavily doped region, the second P-type heavily doped region, the second N-type heavily doped region, the P-well, the deep N-well, the N-well and the P-type substrate is identified as the latch-up structure.

The method for identifying a latch-up structure provided by the embodiments of the disclosure is further described in detail below with reference to specific embodiments.

Figure 5E:
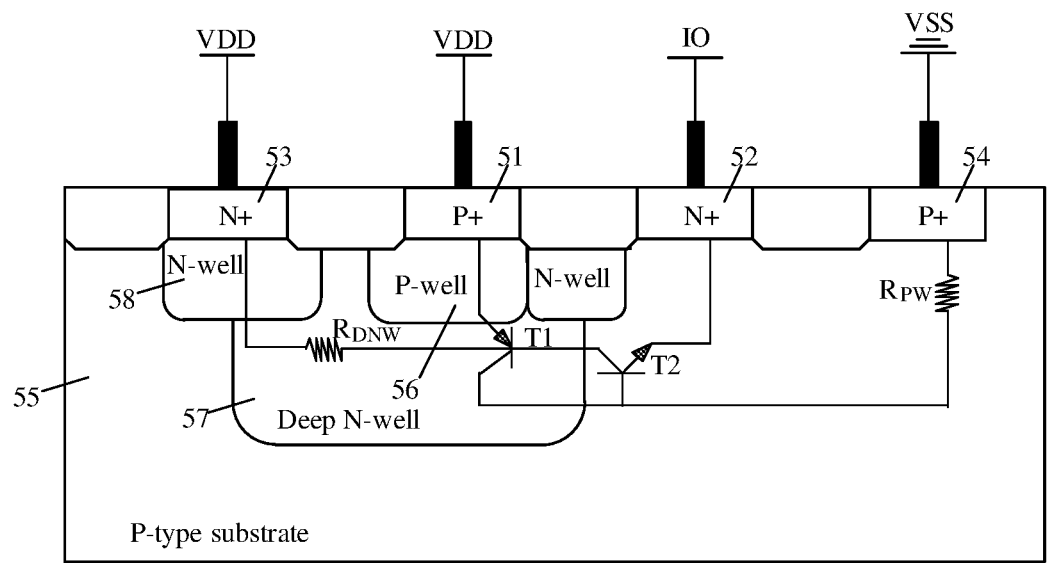
FIG. 5E is a sectional view of a latch-up structure provided in another embodiment of the disclosure.

FIG. 5E is a sectional view of a latch-up structure provided in another embodiment of the disclosure.

Before the operation in 501b is executed, a first input/output pad is found first. The first input/output pad includes a data signal pad (DQ PAD) or an address pad (CA PAD) or other pads.

As shown in FIG. 5E, the operation in 501b is performed. In the chip layout, a first N-type heavily doped region 52 connected to a first input/output pad and located in a P-type substrate 55 is found.

In one embodiment, the operation that the first N-type heavily doped region 52 connected to the first input/output pad and located in the P-type substrate 55 is found includes the following action.

The first N-type heavily doped region 52 directly or indirectly connected to the first input/output pad and located in the P-type substrate 55 is found.

The operation of finding the first N-type heavily doped region 52 directly connected to the first input/output pad refers to that the first input/output pad is directly connected to the first N-type heavily doped region 52 without other devices.

The operation of finding the first N-type heavily doped region 52 indirectly connected to the first input/output pad refers to that the first input/output pad may be connected to the first N-type heavily doped region 52 by means of a high current conducting path. Specifically, the first N-type heavily doped region 52 may be connected to the first input/output pad by means of, for example, a resistor having low resistance, a switching device or a diode. More specifically, the first input/output pad may be connected to the first N-type heavily doped region 52 by means of a backward diode.

Then, the operation in 502b is performed. A first P-type heavily doped region 51 located in a P-well 56 and a second P-type heavily doped region 54 located in the P-type substrate 55 are found, both of which are adjacent to the first N-type heavily doped region 52.

In the present embodiment, the first P-type heavily doped region 51 is connected to a power pad, and the second P-type heavily doped region 54 is connected to a ground pad.

The first P-type heavily doped region 51 may be directly or indirectly connected to the power pad. The indirect connection includes a connection by means of a high current conducting path. Specifically, the first P-type heavily doped region 51 may be connected to the power pad by means of, for example, a resistor having low resistance, a switching device or a diode.

The second P-type heavily doped region 54 may be directly or indirectly connected to the ground pad. The indirect connection includes a connection by means of a high current conducting path. Specifically, the second P-type heavily doped region 54 may be connected to the ground pad by means of, for example, a resistor having low resistance, a switching device or a diode.

The operation that the first P-type heavily doped region 51 located in the P-well 56 and the second P-type heavily doped region 54 located in the P-type substrate 55, both of which are adjacent to the first N-type heavily doped region 52, are found includes the following action. By taking the first N-type heavily doped region 52 as a center and a preset distance as a radius, the first P-type heavily doped region 51 and the second P-type heavily doped region 54 are identified, the distances of which to the first N-type heavily doped region 52 are less than the preset distance.

Then, the operation in 503b is performed. A second N-type heavily doped region 53 adjacent to the first P-type heavily doped region 51 and located in an N-well 58 is found. The P-well 56 is located in a deep N-well 57, the deep N-well 57 is located in the N-well 58, and the N-well 58 is located on the P-type substrate 55. An area formed by the first P-type heavily doped region 51, the first N-type heavily doped region 52, the second P-type heavily doped region 54, the second N-type heavily doped region 53, the P-well 56, the deep N-well 57, the N-well 58 and the P-type substrate 55 is identified as the latch-up structure.

In the present embodiment, the second N-type heavily doped region 53 is connected to the power pad.

The second N-type heavily doped region 53 may be directly or indirectly connected to the power pad. The indirect connection includes a connection by means of a high current conducting path. Specifically, the second N-type heavily doped region 53 may be connected to the power pad by means of, for example, a resistor having low resistance, a switching device or a diode.

The operation that the second N-type heavily doped region 53 adjacent to the first P-type heavily doped region 51 and located in the N-well 58 is found includes the following action. By taking the first P-type heavily doped region 51 as a center and a preset distance as a radius, the second N-type heavily doped region 53 is identified, the distance of which to the first P-type heavily doped region 51 is less than the preset distance.

In one embodiment, as shown in FIG. 5C, there are a first distance L1 between the second N-type heavily doped region 53 and the first P-type heavily doped region 51, a second distance L2 between the first P-type heavily doped region 51 and the first N-type heavily doped region 52, and a third distance L3 between the first N-type heavily doped region 52 and the second P-type heavily doped region 54.

The operation that, by taking the first N-type heavily doped region 52 as a center and a preset distance as a radius, the first P-type heavily doped region 51 and the second P-type heavily doped region 54, the distances of which to the first N-type heavily doped region 52 are less than the preset distance, are identified specifically includes: the second distance and the third distance are both less than the preset distance.

Furthermore, as shown in FIG. 5D and FIG. 5E, the P-well 56, the deep N-well 57 and the P-type substrate 55 form a first parasitic PNP transistor T1. The deep N-well 57, the P-type substrate 55 and the first N-type heavily doped region 52 form a first parasitic NPN transistor T2.

The deep N-well 57 has a first parasitic resistor $R_{DNW}$, a first end of which is connected to the second N-type heavily doped region 53 and a second end of which is connected to a base of the first parasitic PNP transistor T1.

The P-type substrate 55 has a second parasitic resistor $R_{PW}$, a first end of which is connected to the second P-type heavily doped region 54 and a second end of which is connected to a base of the first parasitic NPN transistor T2 and a collector of the first parasitic PNP transistor T1.

The following describes the principle of a latch-up effect. Specifically, T1 is a vertical PNP transistor, the base is the N-well, and a gain from the base to a collector may reach hundreds of times. T2 is a side NPN transistor, the base is the P-type substrate, and a gain to the collector may reach dozens of times. $R_{DNW}$ is a parasitic resistor of the deep N-well, and $R_{PW}$ is a parasitic resistor of the P-type substrate.

The above four elements T1, T2, $R_{DNW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one transistor suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

Figure 6A:
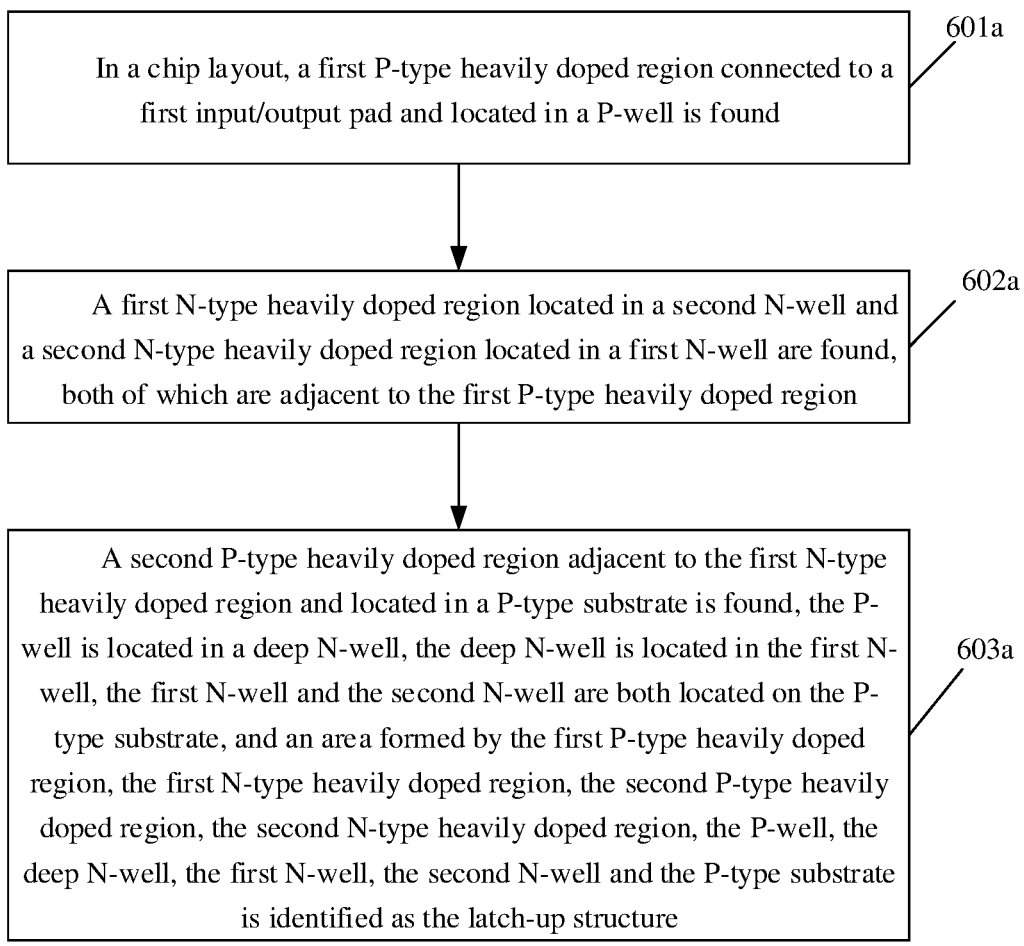
FIG. 6A is a schematic flowchart of a method for identifying a latch-up structure provided in an embodiment of the disclosure.

FIG. 6A is a schematic flowchart of a method for identifying a latch-up structure provided in an embodiment of the disclosure. As shown in FIG. 6A, the method includes the following operations.

In 601a, in a chip layout, a first P-type heavily doped region connected to a first input/output pad and located in a P-well is found.

In 602a, a first N-type heavily doped region located in a second N-well and a second N-type heavily doped region located in a first N-well are found, both of which are adjacent to the first P-type heavily doped region.

In 603a, a second P-type heavily doped region adjacent to the first N-type heavily doped region and located in a P-type substrate is found. The P-well is located in a deep N-well, the deep N-well is located in the first N-well, and the first N-well and the second N-well are both located on the P-type substrate. An area formed by the first P-type heavily doped region, the first N-type heavily doped region, the second P-type heavily doped region, the second N-type heavily doped region, the P-well, the deep N-well, the first N-well, the second N-well and the P-type substrate is identified as the latch-up structure.

The method for identifying a latch-up structure provided by the embodiments of the disclosure is further described in detail below with reference to specific embodiments.

Figure 6B:
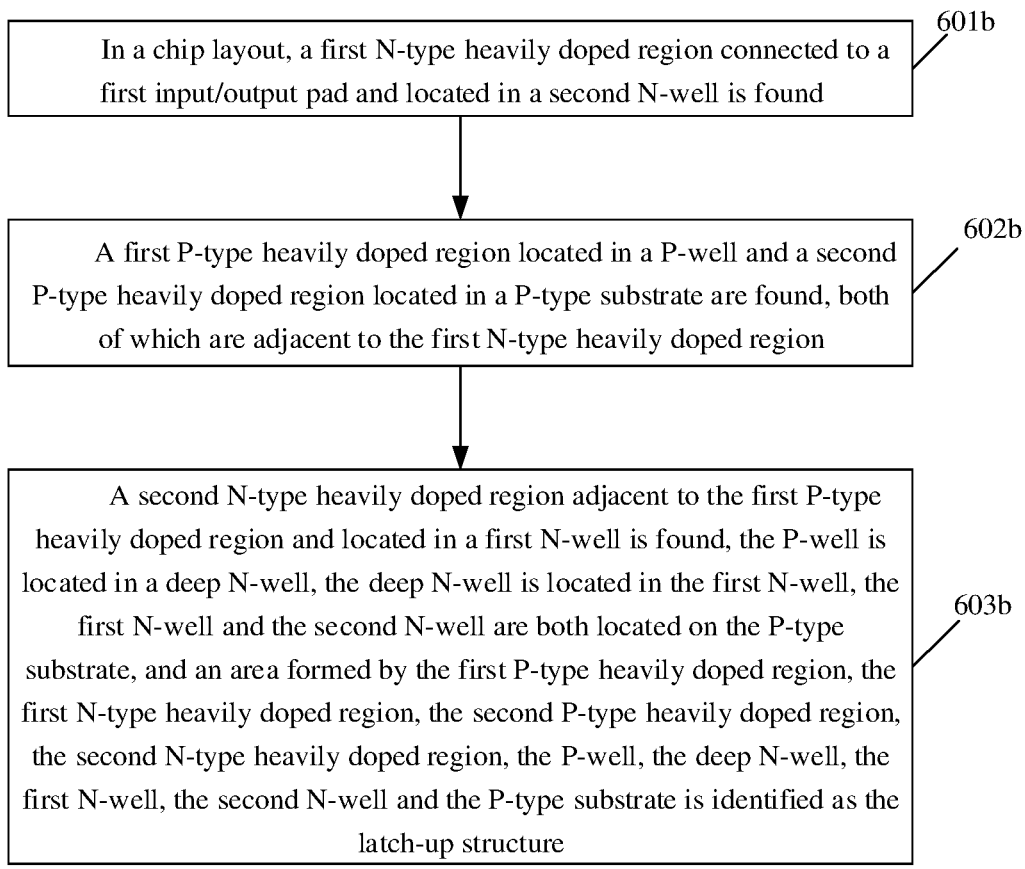
FIG. 6B is a schematic flowchart of a method for identifying a latch-up structure provided in another embodiment of the disclosure.
Figure 6C:
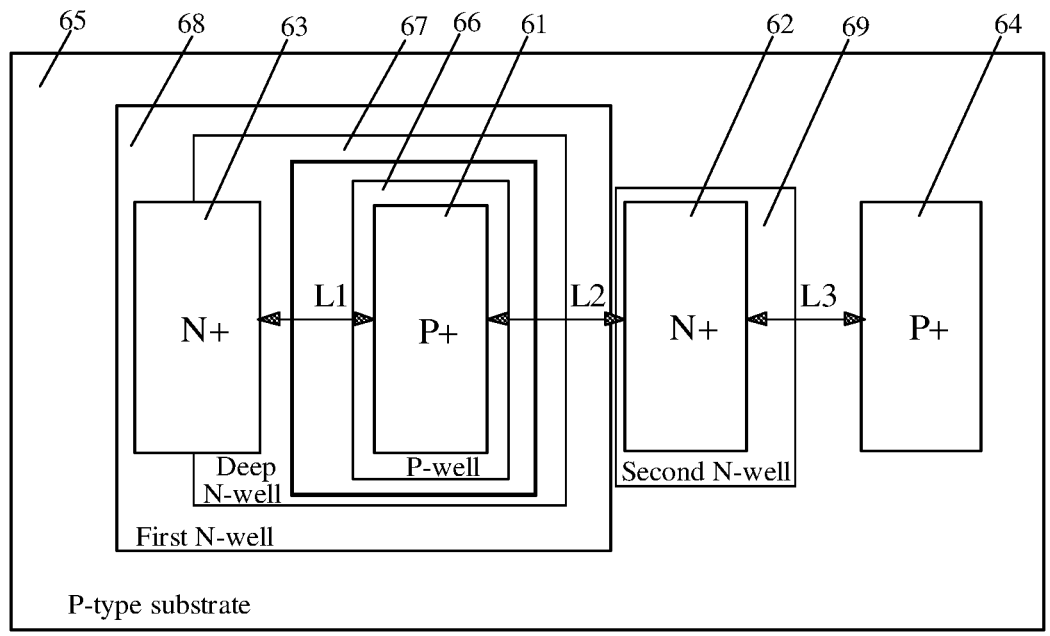
FIG. 6C is a top view of a latch-up structure provided in an embodiment of the disclosure.
Figure 6D:
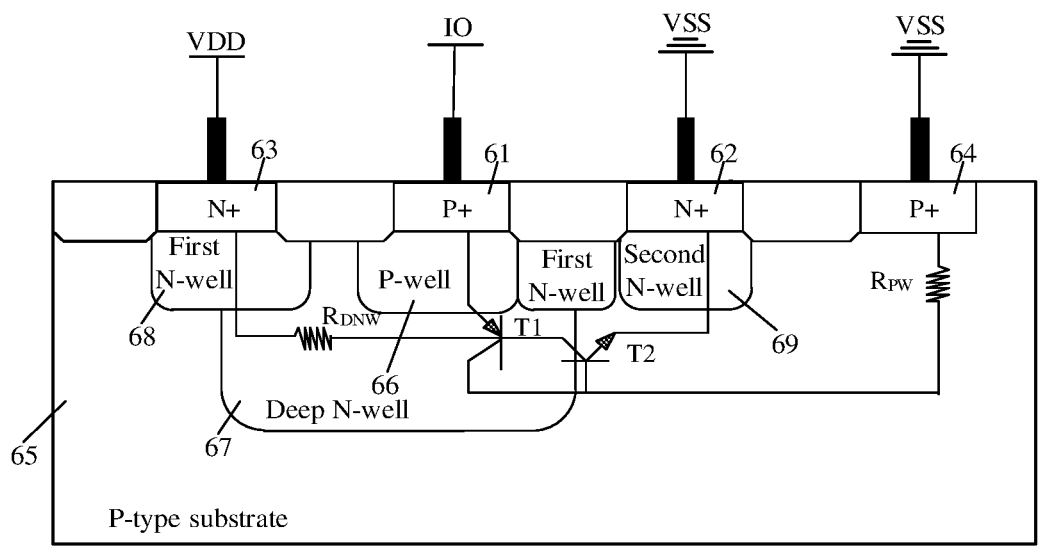
FIG. 6D is a sectional view of a latch-up structure provided in an embodiment of the disclosure.

FIG. 6C is a top view of a latch-up structure provided in an embodiment of the disclosure. FIG. 6D is a sectional view of a latch-up structure provided in an embodiment of the disclosure.

Before the operation in 601a is executed, a first input/output pad is found first. The first input/output pad includes a data signal pad (DQ PAD) or an address pad (CA PAD) or other pads.

As shown in FIG. 6D, the operation in 601a is performed. In a chip layout, a first P-type heavily doped region 61 connected to a first input/output pad and located in a P-well 66 is found.

In one embodiment, the operation that the first P-type heavily doped region 61 connected to the first input/output pad and located in the P-well 66 is found includes the following action.

The first P-type heavily doped region 61 directly or indirectly connected to the first input/output pad and located in the P-well 66 is found.

Here, the operation of finding the first P-type heavily doped region 61 directly connected to the first input/output pad refers to that the first input/output pad is directly connected to the first P-type heavily doped region 61 without other devices.

The operation of finding the first P-type heavily doped region 61 indirectly connected to the first input/output pad refers to that the first input/output pad may be connected to the first P-type heavily doped region 61 by means of a high current conducting path. Specifically, the first P-type heavily doped region 61 may be connected to the first input/output pad by means of, for example, a resistor having low resistance, a switching device or a diode. More specifically, the first input/output pad may be connected to the first P-type heavily doped region 61 by means of a forward diode.

Then, the operation in 602a is performed. A first N-type heavily doped region 62 located in a second N-well 69 and a second N-type heavily doped region 63 located in a first N-well 68 are found, both of which are adjacent to the first P-type heavily doped region 61.

In the present embodiment, the first N-type heavily doped region 62 is connected to a ground pad, and the second N-type heavily doped region 63 is connected to a power pad.

The first N-type heavily doped region 62 may be directly or indirectly connected to the ground pad. The indirect connection includes a connection by means of a high current conducting path. Specifically, the first N-type heavily doped region 62 may be connected to the ground pad by means of, for example, a resistor having low resistance, a switching device or a diode.

The second N-type heavily doped region 63 may be directly or indirectly connected to the power pad. The indirect connection includes a connection by means of a high current conducting path. Specifically, the second N-type heavily doped region 63 may be connected to the power pad by means of, for example, a resistor having low resistance, a switching device or a diode.

In one embodiment, the operation that the first N-type heavily doped region 62 located in the second N-well 69 and the second N-type heavily doped region 63 located in the first N-well 68, both of which are adjacent to the first P-type heavily doped region 61 are found includes the following action. By taking the first P-type heavily doped region 61 as a center and a preset distance as a radius, the first N-type heavily doped region 62 and the second N-type heavily doped region 63 are identified, the distances of which to the first P-type heavily doped region 61 are less than the preset distance.

Then, the operation in 603a is performed. A second P-type heavily doped region 64 adjacent to the first N-type heavily doped region 62 and located in a P-type substrate 65 is found. The P-well 66 is located in a deep N-well 67, the deep N-well 67 is located in the first N-well 68, and the first N-well 68 and the second N-well 69 are both located on the P-type substrate 65. An area formed by the first P-type heavily doped region 61, the first N-type heavily doped region 62, the second P-type heavily doped region 64, the second N-type heavily doped region 63, the P-well 66, the deep N-well 67, the first N-well 68, the second N-well 69 and the P-type substrate 65 is identified as the latch-up structure.

In the present embodiment, the second P-type heavily doped region 64 is connected to the ground pad.

The second P-type heavily doped region 64 may be directly or indirectly connected to the ground pad. The indirect connection includes a connection by means of a high current conducting path. Specifically, the second P-type heavily doped region 64 may be connected to the ground pad by means of, for example, a resistor having low resistance, a switching device or a diode.

The operation that the second P-type heavily doped region 64 adjacent to the first N-type heavily doped region 62 and located in the P-type substrate 65 is found includes the following action. By taking the first N-type heavily doped region 62 as a center and a preset distance as a radius, the second P-type heavily doped region 64 is identified, the distance of which to the first N-type heavily doped region 62 is less than the preset distance.

In one embodiment, as shown in FIG. 6C, there are a first distance L1 between the second N-type heavily doped region 63 and the first P-type heavily doped region 61, a second distance L2 between the first P-type heavily doped region 61 and the first N-type heavily doped region 62, and a third distance L3 between the first N-type heavily doped region 62 and the second P-type heavily doped region 64.

The operation that, by taking the first P-type heavily doped region 61 as a center and a preset distance as a radius, the first N-type heavily doped region 62 and the second N-type heavily doped region 63, the distances of which to the first P-type heavily doped region 61 are less than the preset distance, are identified specifically includes: the second distance and the first distance are both less than the preset distance.

FIG. 6B is a schematic flowchart of a method for identifying a latch-up structure provided in an embodiment of the disclosure. As shown in FIG. 6B, the method includes the following the operations.

In 601b, in the chip layout, a first N-type heavily doped region connected to a first input/output pad and located in a second N-well is found.

In 602b, a first P-type heavily doped region located in a P-well and a second P-type heavily doped region located in a P-type substrate are found, both of which are adjacent to the first N-type heavily doped region.

In 603b, a second N-type heavily doped region adjacent to the first P-type heavily doped region and located in a first N-well is found. The P-well is located in a deep N-well, the deep N-well is located in the first N-well, and the first N-well and the second N-well are both located on the P-type substrate. An area formed by the first P-type heavily doped region, the first N-type heavily doped region, the second P-type heavily doped region, the second N-type heavily doped region, the P-well, the deep N-well, the first N-well, the second N-well and the P-type substrate is identified as the latch-up structure.

The method for identifying a latch-up structure provided by the embodiments of the disclosure is further described in detail below with reference to specific embodiments.

Figure 6E:
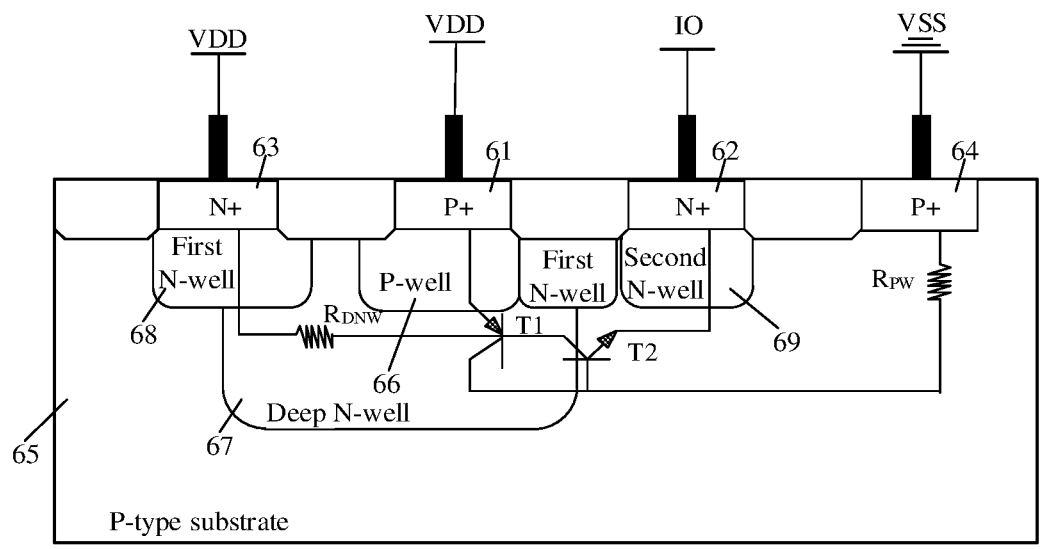
FIG. 6E is a sectional view of a latch-up structure provided in another embodiment of the disclosure.

FIG. 6E is a sectional view of a latch-up structure provided in another embodiment of the disclosure.

Before the operation in 601b is executed, a first input/output pad is found first. The first input/output pad includes a data signal pad (DQ PAD) or an address pad (CA PAD) or other pads.

As shown in FIG. 6E, the operation in 601b is performed. In the chip layout, a first N-type heavily doped region 62 connected to a first input/output pad and located in a second N-well 69 is found.

In one embodiment, the operation that the first N-type heavily doped region 62 connected to the first input/output pad and located in the second N-well 69 is found includes the following action.

The first N-type heavily doped region 62 directly or indirectly connected to the first input/output pad and located in the second N-well 69 is found.

The operation of finding the first N-type heavily doped region 62 directly connected to the first input/output pad refers to that the first input/output pad is directly connected to the first N-type heavily doped region 62 without other devices.

The operation of finding the first N-type heavily doped region 62 indirectly connected to the first input/output pad refers to that the first input/output pad may be connected to the first N-type heavily doped region 62 by means of a high current conducting path. Specifically, the first N-type heavily doped region 62 may be connected to the first input/output pad by means of, for example, a resistor having low resistance, a switching device or a diode. More specifically, the first input/output pad may be connected to the first N-type heavily doped region 62 by means of a backward diode.

Then, the operation in 602b is performed. A first P-type heavily doped region 61 located in a P-well 66 and a second P-type heavily doped region 64 located in a P-type substrate 65 are found, both of which are adjacent to the first N-type heavily doped region 62.

In the present embodiment, the first P-type heavily doped region 61 is connected to a power pad, and the second P-type heavily doped region 64 is connected to a ground pad.

The first P-type heavily doped region 61 may be directly or indirectly connected to the power pad. The indirect connection includes a connection by means of a high current conducting path. Specifically, the first P-type heavily doped region 61 may be connected to the power pad by means of, for example, a resistor having low resistance, a switching device or a diode.

The second P-type heavily doped region 64 may be directly or indirectly connected to the ground pad. The indirect connection includes a connection by means of a high current conducting path. Specifically, the second P-type heavily doped region 64 may be connected to the ground pad by means of, for example, a resistor having low resistance, a switching device or a diode.

The operation that the first P-type heavily doped region 61 located in the P-well 66 and the second P-type heavily doped region 64 located in the P-type substrate 65, both of which are adjacent to the first N-type heavily doped region 62 are found includes the following action. By taking the first N-type heavily doped region 62 as a center and a preset distance as a radius, the first P-type heavily doped region 61 and the second P-type heavily doped region 64 are identified, the distances of which to the first N-type heavily doped region 62 are less than the preset distance.

Then, the operation in 603b is performed. A second N-type heavily doped region 63 adjacent to the first P-type heavily doped region 61 and located in a first N-well 68 is found. The P-well 66 is located in a deep N-well 67, the deep N-well 67 is located in the first N-well 68, and the first N-well 68 and the second N-well 69 are both located on the P-type substrate 65. An area formed by the first P-type heavily doped region 61, the first N-type heavily doped region 62, the second P-type heavily doped region 64, the second N-type heavily doped region 63, the P-well 66, the deep N-well 67, the first N-well 68, the second N-well 69 and the P-type substrate 65 is identified as the latch-up structure.

In the present embodiment, the second N-type heavily doped region 63 is connected to the power pad.

The second N-type heavily doped region 63 may be directly or indirectly connected to the power pad. The indirect connection includes a connection by means of a high current conducting path. Specifically, the second N-type heavily doped region 63 may be connected to the power pad by means of, for example, a resistor having low resistance, a switching device or a diode.

The operation that the second N-type heavily doped region 63 adjacent to the first P-type heavily doped region 61 and located in the first N-well 68 is found includes the following action. By taking the first P-type heavily doped region 61 as a center and a preset distance as a radius, the second N-type heavily doped region 63 is identified, the distance of which to the first P-type heavily doped region 61 is less than the preset distance.

In one embodiment, as shown in FIG. 6C, there are a first distance L1 between the second N-type heavily doped region 63 and the first P-type heavily doped region 61, a second distance L2 between the first P-type heavily doped region 61 and the first N-type heavily doped region 62, and a third distance L3 between the first N-type heavily doped region 62 and the second P-type heavily doped region 64.

The operation that, by taking the first N-type heavily doped region 62 as a center and a preset distance as a radius, the first P-type heavily doped region 61 and the second P-type heavily doped region 64 are identified, the distances of which to the first N-type heavily doped region 62 are less than the preset distance, specifically includes: the second distance and the third distance are both less than the preset distance.

Furthermore, as shown in FIG. 6D and FIG. 6E, the P-well 66, the deep N-well 67 and the P-type substrate 65 form a first parasitic PNP transistor T1. The deep N-well 67, the P-type substrate 65 and the second N-well 69 form a first parasitic NPN transistor T2.

The deep N-well 67 has a first parasitic resistor $R_{DNW}$, a first end of which is connected to the second N-type heavily doped region 63 and a second end of which is connected to a base of the first parasitic PNP transistor T1.

The P-type substrate 65 has a second parasitic resistor $R_{PW}$, a first end of which is connected to the second P-type heavily doped region 64 and a second end of which is connected to a base of the first parasitic NPN transistor T2 and a collector of the first parasitic PNP transistor T1.

The following describes the principle of a latch-up effect. Specifically, T1 is a vertical PNP transistor, the base is the N-well, and a gain from the base to a collector may reach hundreds of times. T2 is a side NPN transistor, the base is the P-type substrate, and a gain to the collector may reach dozens of times. $R_{DNW}$ is a parasitic resistor of the deep N-well, and $R_{PW}$ is a parasitic resistor of the P-type substrate.

The above four elements T1, T2, $R_{DNW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one of the transistors suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

Figure 7A:
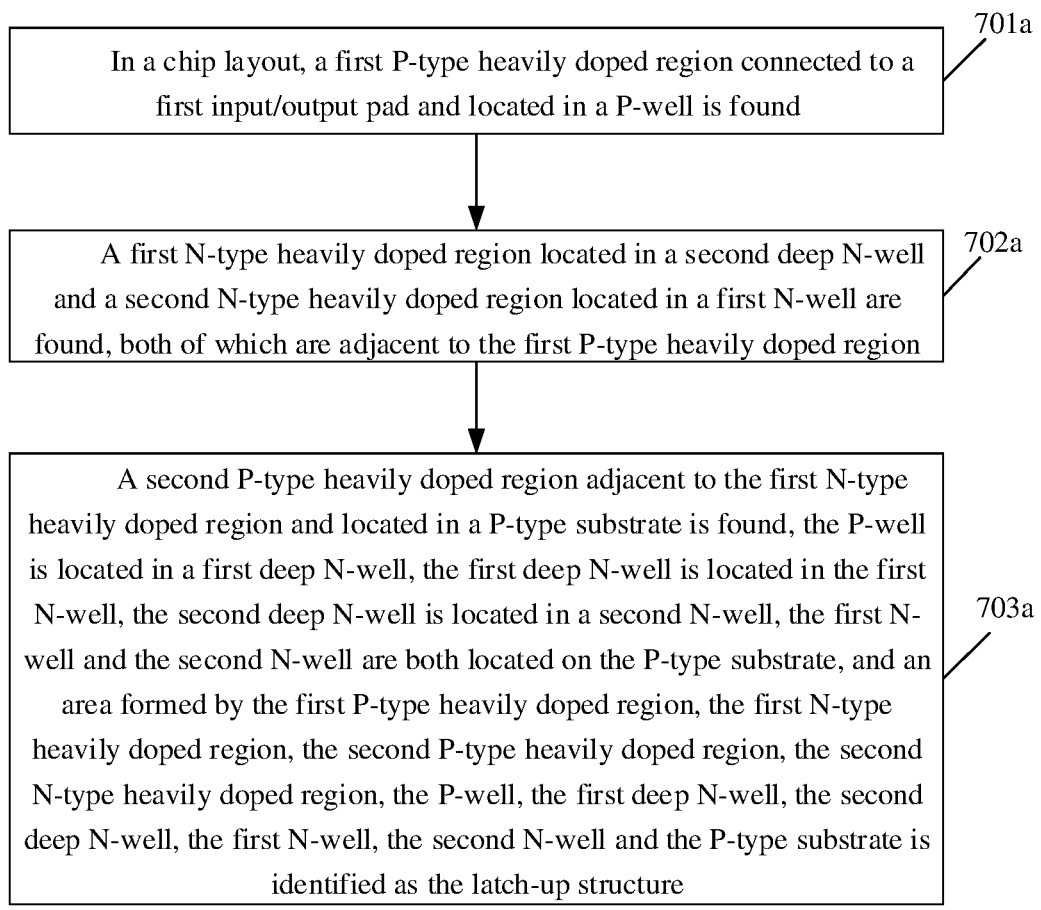
FIG. 7A is a schematic flowchart of a method for identifying a latch-up structure provided in an embodiment of the disclosure.

FIG. 7A is a schematic flowchart of a method for identifying a latch-up structure provided in an embodiment of the disclosure. As shown in FIG. 7A, the method includes the following the operations.

In 701a, in a chip layout, a first P-type heavily doped region connected to a first input/output pad and located in a P-well is found.

In 702a, a first N-type heavily doped region located in a second deep N-well and a second N-type heavily doped region located in a first N-well are found, both of which are adjacent to the first P-type heavily doped region.

In 703a, a second P-type heavily doped region adjacent to the first N-type heavily doped region and located in a P-type substrate is found. The P-well is located in a first deep N-well, the first deep N-well is located in the first N-well, the second deep N-well is located in a second N-well, and the first N-well and the second N-well are both located on the P-type substrate. An area formed by the first P-type heavily doped region, the first N-type heavily doped region, the second P-type heavily doped region, the second N-type heavily doped region, the P-well, the first deep N-well, the second deep N-well, the first N-well, the second N-well and the P-type substrate is identified as the latch-up structure.

The method for identifying a latch-up structure provided by the embodiments of the disclosure is further described in detail below with reference to specific embodiments.

Figure 7B:
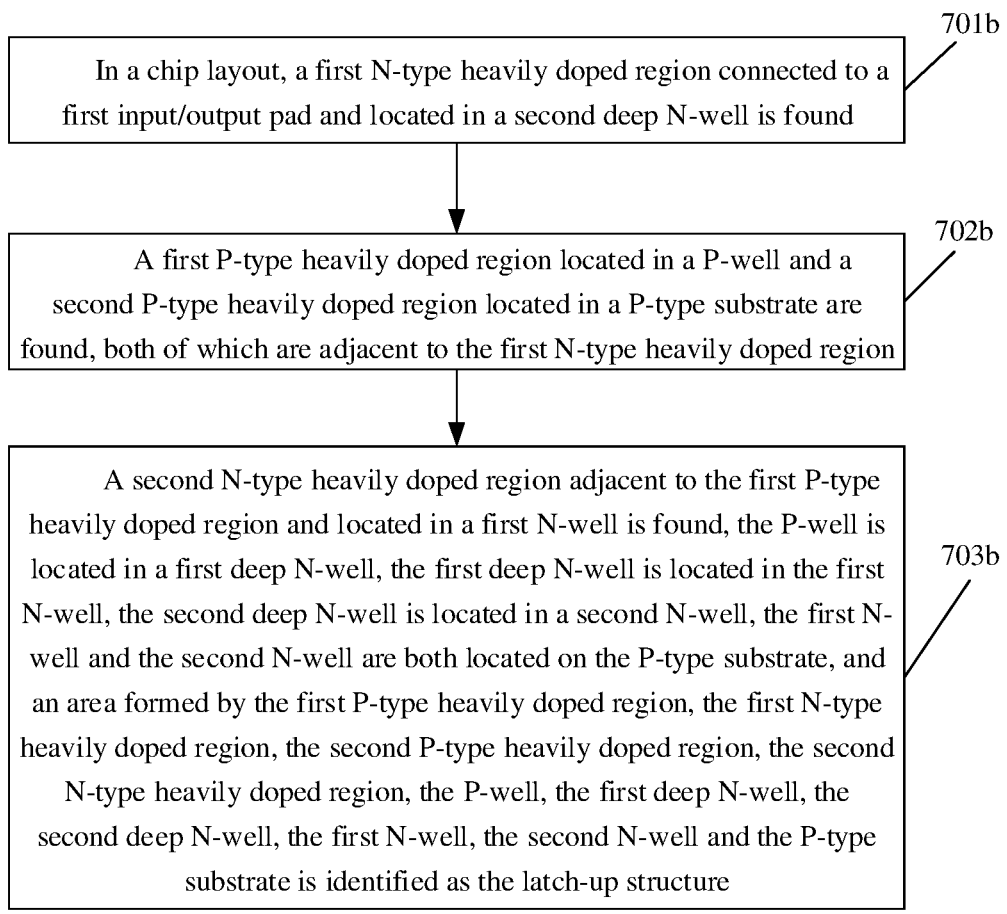
FIG. 7B is a schematic flowchart of a method for identifying a latch-up structure provided in another embodiment of the disclosure.
Figure 7C:
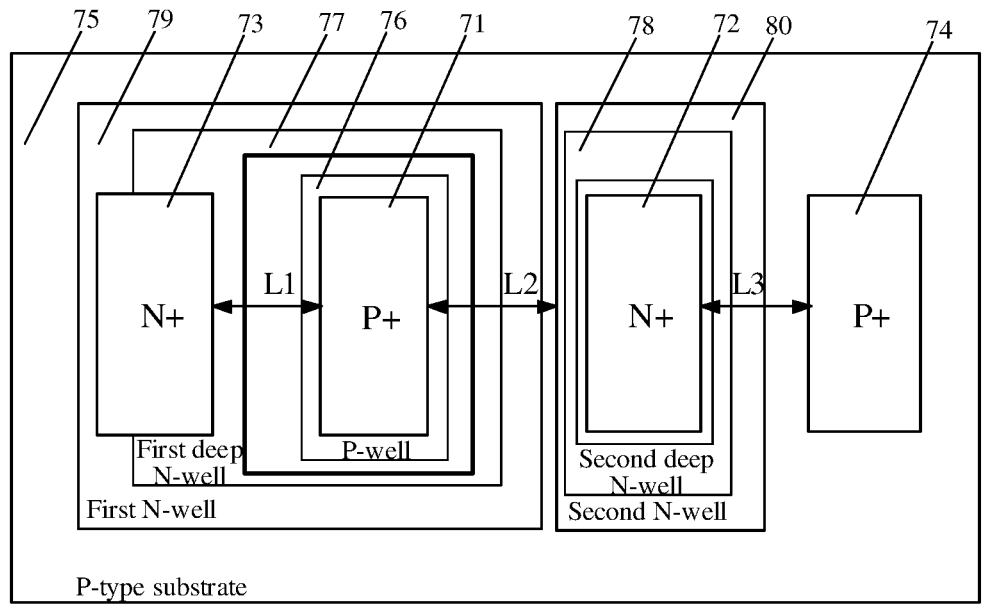
FIG. 7C is a top view of a latch-up structure provided in an embodiment of the disclosure.
Figure 7D:
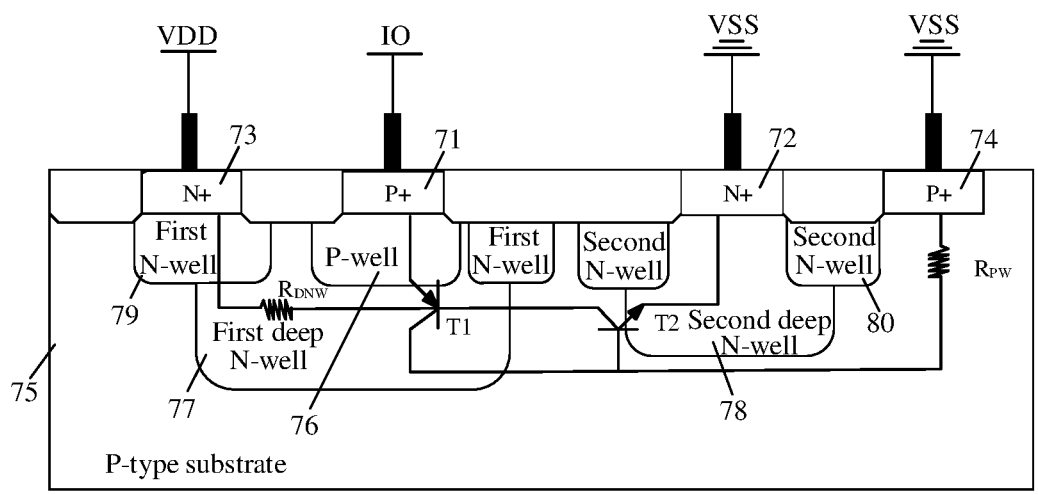
FIG. 7D is a sectional view of a latch-up structure provided in an embodiment of the disclosure.

FIG. 7C is a top view of a latch-up structure provided in an embodiment of the disclosure. FIG. 7D is a sectional view of a latch-up structure provided in an embodiment of the disclosure.

Before the operation in 701a is executed, a first input/output pad is found first. The first input/output pad includes a data signal pad (DQ PAD) or an address pad (CA PAD) or other pads.

As shown in FIG. 7D, the operation in 701a is performed. In a chip layout, a first P-type heavily doped region 71 connected to a first input/output pad and located in a P-well 76 is found.

In one embodiment, the operation that the first P-type heavily doped region 71 connected to the first input/output pad and located in the P-well 76 is found includes the following action.

The first P-type heavily doped region 71 directly or indirectly connected to the first input/output pad and located in the P-well 76 is found.

The operation of finding the first P-type heavily doped region 71 directly connected to the first input/output pad refers to that the first input/output pad is directly connected to the first P-type heavily doped region 71 without other devices.

The operation of finding the first P-type heavily doped region 71 indirectly connected to the first input/output pad refers to that the first input/output pad may be connected to the first P-type heavily doped region 71 by means of a high current conducting path. Specifically, the first P-type heavily doped region 71 may be connected to the first input/output pad by means of, for example, a resistor having low resistance, a switching device or a diode. More specifically, the first input/output pad may be connected to the first P-type heavily doped region 71 by means of a forward diode.

Then, the operation in 702a is performed. A first N-type heavily doped region 72 located in a second deep N-well 78 and a second N-type heavily doped region 73 located in a first N-well 79 are found, both of which are adjacent to the first P-type heavily doped region 71.

In the present embodiment, the first N-type heavily doped region 72 is connected to a ground pad, and the second N-type heavily doped region 73 is connected to a power pad.

The first N-type heavily doped region 72 may be directly or indirectly connected to the ground pad. The indirect connection includes a connection by means of a high current conducting path. Specifically, the first N-type heavily doped region 72 may be connected to the ground pad by means of, for example, a resistor having low resistance, a switching device or a diode.

The second N-type heavily doped region 73 may be directly or indirectly connected to the power pad. The indirect connection includes a connection by means of a high current conducting path. Specifically, the second N-type heavily doped region 73 may be connected to the power pad by means of, for example, a resistor having low resistance, a switching device or a diode.

In one embodiment, the operation that the first N-type heavily doped region 72 located in the second deep N-well 78 and the second N-type heavily doped region 73 located in the first N-well 79, both of which are adjacent to the first P-type heavily doped region 71, are found includes the following action. By taking the first P-type heavily doped region 71 as a center and a preset distance as a radius, the first N-type heavily doped region 72 and the second N-type heavily doped region 73 are identified, the distances of which to the first P-type heavily doped region 71 are less than the preset distance.

Then, the operation in 703a is performed. A second P-type heavily doped region 74 adjacent to the first N-type heavily doped region 72 and located in a P-type substrate 75 is found. The P-well 76 is located in a first deep N-well 77, the first deep N-well 77 is located in the first N-well 79, the second deep N-well 78 is located in a second N-well 80, and the first N-well 79 and the second N-well 80 are both located on the P-type substrate 75. An area formed by the first P-type heavily doped region 71, the first N-type heavily doped region 72, the second P-type heavily doped region 74, the second N-type heavily doped region 73, the P-well 76, the first deep N-well 77, the second deep N-well 78, the first N-well 79, the second N-well 80 and the P-type substrate 75 is identified as the latch-up structure.

In the present embodiment, the second P-type heavily doped region 74 is connected to the ground pad.

The second P-type heavily doped region 74 may be directly or indirectly connected to the ground pad. The indirect connection includes a connection by means of a high current conducting path. Specifically, the second P-type heavily doped region 74 may be connected to the ground pad by means of, for example, a resistor having low resistance, a switching device or a diode.

The operation that the second P-type heavily doped region 74 adjacent to the first N-type heavily doped region 72 and located in the P-type substrate 75 is found includes the following action. By taking the first N-type heavily doped region 72 as a center and a preset distance as a radius, the second P-type heavily doped region 74 is identified, the distance of which to the first N-type heavily doped region 72 is less than the preset distance.

In one embodiment, as shown in FIG. 7C, there are a first distance L1 between the second N-type heavily doped region 73 and the first P-type heavily doped region 71, a second distance L2 between the first P-type heavily doped region 71 and the first N-type heavily doped region 72, and a third distance L3 between the first N-type heavily doped region 72 and the second P-type heavily doped region 74.

The operation that, by taking the first P-type heavily doped region 71 as a center and a preset distance as a radius, the first N-type heavily doped region 72 and the second N-type heavily doped region 73 are identified, the distances of which to the first P-type heavily doped region 71 are less than the preset distance, specifically includes: the second distance and the first distance are both less than the preset distance.

FIG. 7B is a schematic flowchart of a method for identifying a latch-up structure provided in another embodiment of the disclosure. As shown in FIG. 7B, the method includes the following the operations.

In 701b, in the chip layout, a first N-type heavily doped region connected to a first input/output pad and located in a second deep N-well is found.

In 702b, a first P-type heavily doped region located in a P-well and a second P-type heavily doped region located in a P-type substrate are found, both of which are adjacent to the first N-type heavily doped region.

In 703b, a second N-type heavily doped region adjacent to the first P-type heavily doped region and located in a first N-well is found. The P-well is located in a first deep N-well, the first deep N-well is located in the first N-well, the second deep N-well is located in a second N-well, and the first N-well and the second N-well are both located on the P-type substrate. An area formed by the first P-type heavily doped region, the first N-type heavily doped region, the second P-type heavily doped region, the second N-type heavily doped region, the P-well, the first deep N-well, the second deep N-well, the first N-well, the second N-well and the P-type substrate is identified as the latch-up structure.

The method for identifying a latch-up structure provided by the embodiments of the disclosure is further described in detail below with reference to specific embodiments.

Figure 7E:
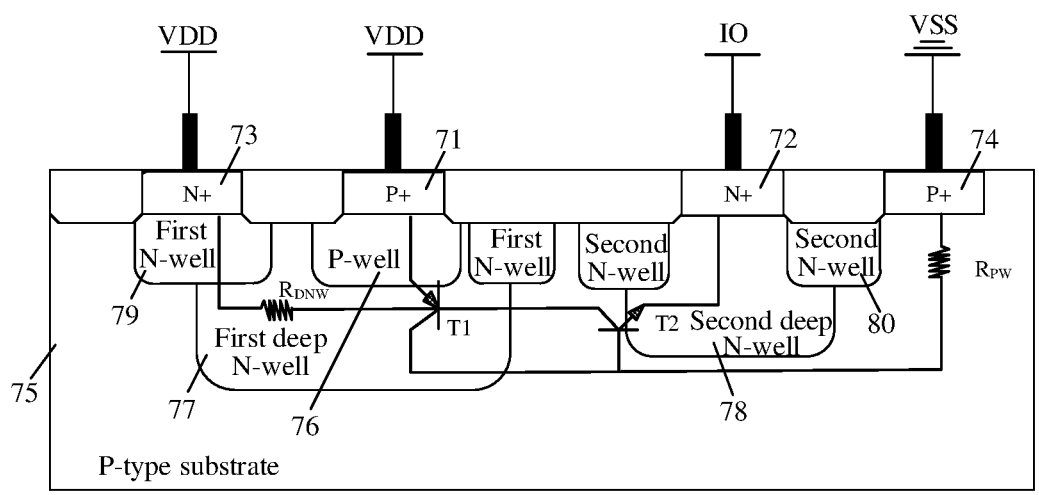
FIG. 7E is a sectional view of a latch-up structure provided in another embodiment of the disclosure.

FIG. 7E is a sectional view of a latch-up structure provided in another embodiment of the disclosure.

Before the operation in 701b is executed, a first input/output pad is found first. The first input/output pad includes a data signal pad (DQ PAD) or an address pad (CA PAD) or other pads.

As shown in FIG. 7E, the operation in 701b is performed. In a chip layout, a first N-type heavily doped region 72 connected to a first input/output pad and located in a second deep N-well 78 is found.

In one embodiment, the operation that the first N-type heavily doped region 72 connected to the first input/output pad and located in the second deep N-well 78 is found includes the following action.

The first N-type heavily doped region 72 directly or indirectly connected to the first input/output pad and located in the second deep N-well 78 is found.

The operation of finding the first N-type heavily doped region 72 directly connected to the first input/output pad refers to that the first input/output pad is directly connected to the first N-type heavily doped region 72 without other devices.

The operation of finding the first N-type heavily doped region 72 indirectly connected to the first input/output pad refers to that the first input/output pad may be connected to the first N-type heavily doped region 72 by means of a high current conducting path. Specifically, the first N-type heavily doped region 72 may be connected to the first input/output pad by means of, for example, a resistor having low resistance, a switching device or a diode. More specifically, the first input/output pad may be connected to the first N-type heavily doped region 72 by means of a backward diode.

Then, the operation in 702b is performed. A first P-type heavily doped region 71 located in a P-well 76 and a second P-type heavily doped region 74 located in a P-type substrate 75 are found, both of which are adjacent to the first N-type heavily doped region 72.

In the present embodiment, the first P-type heavily doped region 71 is connected to a power pad, and the second P-type heavily doped region 74 is connected to a ground pad.

The first P-type heavily doped region 71 may be directly or indirectly connected to the power pad. The indirect connection includes a connection by means of a high current conducting path. Specifically, the first P-type heavily doped region 71 may be connected to the power pad by means of, for example, a resistor having low resistance, a switching device or a diode.

The second P-type heavily doped region 74 may be directly or indirectly connected to the ground pad. The indirect connection includes a connection by means of a high current conducting path. Specifically, the second P-type heavily doped region 74 may be connected to the ground pad by means of, for example, a resistor having low resistance, a switching device or a diode.

In one embodiment, the operation that the first P-type heavily doped region 71 located in the P-well 76 and the second P-type heavily doped region 74 located in the P-type substrate 75, both of which are adjacent to the first N-type heavily doped region 72, are found includes the following action. By taking the first N-type heavily doped region 72 as a center and a preset distance as a radius, the first P-type heavily doped region 71 and the second P-type heavily doped region 74 are identified, the distances of which to the first N-type heavily doped region 72 are less than the preset distance. Here, the preset distance in the embodiments of the disclosure may be obtained according to design rules of the chip layout.

Then, the operation in 703b is performed. A second N-type heavily doped region 73 adjacent to the first P-type heavily doped region 71 and located in a first N-well 79 is found. The P-well 76 is located in a first deep N-well 77, the first deep N-well 77 is located in the first N-well 79, the second deep N-well 78 is located in a second N-well 80, and the first N-well 79 and the second N-well 80 are both located on the P-type substrate 75. An area formed by the first P-type heavily doped region 71, the first N-type heavily doped region 72, the second P-type heavily doped region 74, the second N-type heavily doped region 73, the P-well 76, the first deep N-well 77, the second deep N-well 78, the first N-well 79, the second N-well 80 and the P-type substrate 75 is identified as the latch-up structure.

In the present embodiment, the second N-type heavily doped region 73 is connected to the power pad.

The second N-type heavily doped region 73 may be directly or indirectly connected to the power pad. The indirect connection includes a connection by means of a high current conducting path. Specifically, the second N-type heavily doped region 73 may be connected to the power pad by means of, for example, a resistor having low resistance, a switching device or a diode.

In one embodiment, the operation that the second N-type heavily doped region 73 adjacent to the first P-type heavily doped region 71 and located in the first N-well 79 is found includes the following action. By taking the first P-type heavily doped region 71 as a center and a preset distance as a radius, the second N-type heavily doped region 73 is identified, the distance of which to the first P-type heavily doped region 71 is less than the preset distance.

In one embodiment, as shown in FIG. 7C, there are a first distance L1 between the second N-type heavily doped region 73 and the first P-type heavily doped region 71, a second distance L2 between the first P-type heavily doped region 71 and the first N-type heavily doped region 72, and a third distance L3 between the first N-type heavily doped region 72 and the second P-type heavily doped region 74.

The operation that, by taking the first N-type heavily doped region 72 as a center and a preset distance as a radius, the first P-type heavily doped region 71 and the second P-type heavily doped region 74 are identified, the distances of which to the first N-type heavily doped region 72 are less than the preset distance, specifically includes: the second distance and the third distance are both less than the preset distance.

Furthermore, as shown in FIG. 7D and FIG. 7E, the P-well 76, the first deep N-well 77 and the P-type substrate 75 form a first parasitic PNP transistor T1. The first deep N-well 77, the P-type substrate 75 and the second deep N-well 78 form a first parasitic NPN transistor T2.

The first deep N-well 77 has a first parasitic resistor $R_{DNW}$, a first end of which is connected to the second N-type heavily doped region 73 and a second end of which is connected to a base of the first parasitic PNP transistor T1.

The P-type substrate 75 has a second parasitic resistor $R_{PW}$, a first end of which is connected to the second P-type heavily doped region 74 and a second end of which is connected to a base of the first parasitic NPN transistor T2 and a collector of the first parasitic PNP transistor T1.

The following describes the principle of a latch-up effect. Specifically, T1 is a vertical PNP transistor, the base is the N-well, and a gain from the base to a collector may reach hundreds of times. T2 is a side NPN transistor, the base is the P-type substrate, and a gain to the collector may reach dozens of times. $R_{DNW}$ is a parasitic resistor of the first deep N-well, and $R_{PW}$ is a parasitic resistor of the P-type substrate.

The above four elements T1, T2, $R_{DNW}$ and $R_{PW}$ form a silicon controlled circuit. When there is no external interference and no trigger is caused, the two transistors are in an off state, a collector current is formed by a reverse leakage current of C-B, and a current gain is extremely small, so a latch-up effect is not generated at this time. When a collector current of one of the transistors suddenly increases to a certain value due to external interference, a feedback is sent to the other transistor, so that the two transistors are triggered to be turned on (generally, PNP is easier to be triggered), and a low-impedance path is formed between the power pad VDD and the ground pad VSS. Afterwards, even if the external interference disappears, because a positive feedback is formed between the two triodes, there is still a leakage current between the power pad VDD and the ground pad VSS, i.e., a locked state. The latch-up effect is generated thereby.

The foregoing descriptions are merely preferred embodiments of the disclosure, and are not intended to limit the scope of protection of the embodiments of the disclosure. Any modification, equivalent replacement, improvement and the like made within the spirit and principle of the embodiments of the disclosure shall fall within the scope of protection of the embodiments of the disclosure.

INDUSTRIAL APPLICABILITY

In the embodiments of the disclosure, by finding a first N-type heavily doped region connected to a first input/output pad or a first P-type heavily doped region connected to a first input/output pad, and respectively finding another P-type or N-type heavily doped region by means of the first N-type heavily doped region or the first P-type heavily doped region, a latch-up structure connected to the first input/output pad is identified, so that safety of the latch-up structure can be inspected by using corresponding design rules, and reliability of a device is ensured.

What is claimed is:

1. A method for identifying a latch-up structure, comprising:
   in a chip layout, finding a first positive-type (P-type) heavily doped region connected to a first input/output pad and located in a P-well;
   finding a first negative-type (N-type) heavily doped region located in a P-type substrate and a second N-type heavily doped region located in an N-well, both of which being adjacent to the first P-type heavily doped region;
   finding a second P-type heavily doped region adjacent to the first N-type heavily doped region and located in the P-type substrate, wherein the P-well is located in a deep N-well, the deep N-well is located in the N-well, and the N-well is located on the P-type substrate; and
   identifying an area formed by the first P-type heavily doped region, the first N-type heavily doped region, the second P-type heavily doped region, the second N-type heavily doped region, the P-well, the deep N-well, the N-well and the P-type substrate as the latch-up structure;
   or,
   in the chip layout, finding a first N-type heavily doped region connected to the first input/output pad and located in the P-type substrate;
   finding a first P-type heavily doped region located in the P-well and a second P-type heavily doped region located in the P-type substrate, both of which being adjacent to the first N-type heavily doped region; and
   finding a second N-type heavily doped region adjacent to the first P-type heavily doped region and located in the N-well, wherein the P-well is located in the deep N-well, the deep N-well is located in the N-well and the N-well is located on the P-type substrate; and
   identifying an area formed by the first P-type heavily doped region, the first N-type heavily doped region, the second P-type heavily doped region, the second N-type heavily doped region, the P-well, the deep N-well, the N-well and the P-type substrate as the latch-up structure.

2. The method of claim 1, wherein
   finding the first N-type heavily doped region located in the P-type substrate and the second N-type heavily doped region located in the N-well, both of which being adjacent to the first P-type heavily doped region comprises:
   identifying, by taking the first P-type heavily doped region as a center and a preset distance as a radius, the first N-type heavily doped region and the second N-type heavily doped region, the distances of which to the first P-type heavily doped region being less than the preset distance; and
   finding the first P-type heavily doped region located in the P-well and the second P-type heavily doped region located in the P-type substrate, both of which being adjacent to the first N-type heavily doped region comprises:
   identifying, by taking the first N-type heavily doped region as a center and a preset distance as a radius, the first P-type heavily doped region and the second P-type heavily doped region, the distances of which to the first N-type heavily doped region being less than the preset distance.

3. The method of claim 1, wherein
   finding the first P-type heavily doped region connected to the first input/output pad and located in the P-well comprises:
   finding the first P-type heavily doped region directly or indirectly connected to the first input/output pad and located in the P-well; and
   finding the first N-type heavily doped region connected to the first input/output pad and located in the P-type substrate comprises:
   finding the first N-type heavily doped region directly or indirectly connected to the first input/output pad and located in the P-type substrate.

4. A method for identifying a latch-up structure, comprising:
   in a chip layout, finding a first positive-type (P-type) heavily doped region connected to a first input/output pad and located in a P-well;
   finding a first negative-type (N-type) heavily doped region located in a second N-well and a second N-type heavily doped region located in a first N-well, both of which being adjacent to the first P-type heavily doped region;
   finding a second P-type heavily doped region adjacent to the first N-type heavily doped region and located in a P-type substrate, wherein the P-well is located in a deep N-well, the deep N-well is located in the first N-well, and the first N-well and the second N-well are both located on the P-type substrate; and
   identifying an area formed by the first P-type heavily doped region, the first N-type heavily doped region, the second P-type heavily doped region, the second N-type heavily doped region, the P-well, the deep N-well, the first N-well, the second N-well and the P-type substrate as the latch-up structure;
   or,
   in the chip layout, finding a first N-type heavily doped region connected to the first input/output pad and located in the second N-well;
   finding a first P-type heavily doped region located in the P-well and a second P-type heavily doped region located in the P-type substrate, both of which being adjacent to the first N-type heavily doped region;
   finding a second N-type heavily doped region adjacent to the first P-type heavily doped region and located in the first N-well, wherein the P-well is located in a deep N-well, the deep N-well is located in the first N-well, and the first N-well and the second N-well are both located on the P-type substrate; and
   identifying an area formed by the first P-type heavily doped region, the first N-type heavily doped region, the second P-type heavily doped region, the second N-type heavily doped region, the P-well, the deep N-well, the first N-well, the second N-well and the P-type substrate as the latch-up structure.

5. The method of claim 4, wherein
   finding the first N-type heavily doped region located in the second N-well and the second N-type heavily doped region located in the first N-well, both of which being adjacent to the first P-type heavily doped region comprises:
   identifying, by taking the first P-type heavily doped region as a center and a preset distance as a radius, the first N-type heavily doped region and the second N-type heavily doped region, the distances of which to the first P-type heavily doped region being less than the preset distance; and finding the first P-type heavily doped region located in the P-well and the second P-type heavily doped region located in the P-type substrate, both of which being adjacent to the first N-type heavily doped region comprises:

identifying, by taking the first N-type heavily doped region as a center and a preset distance as a radius, the first P-type heavily doped region and the second P-type heavily doped region, the distances of which to the first N-type heavily doped region being less than the preset distance.

6. The method of claim 4, wherein finding the first P-type heavily doped region connected to the first input/output pad and located in the P-well comprises:

finding the first P-type heavily doped region directly or indirectly connected to the first input/output pad and located in the P-well; and finding the first N-type heavily doped region connected to the first input/output pad and located in the second N-well comprises:

finding the first N-type heavily doped region directly or indirectly connected to the first input/output pad and located in the second N-well.

7. A method for identifying a latch-up structure, comprising:

in a chip layout, finding a first positive-type (P-type) heavily doped region connected to a first input/output pad and located in a P-well;

finding a first negative-type (N-type) heavily doped region located in a second deep N-well and a second N-type heavily doped region located in a first N-well, both of which being adjacent to the first P-type heavily doped region;

finding a second P-type heavily doped region adjacent to the first N-type heavily doped region and located in a P-type substrate, wherein the P-well is located in a first deep N-well, the first deep N-well is located in the first N-well, the second deep N-well is located in a second N-well, and the first N-well and the second N-well are both located on the P-type substrate; and identifying an area formed by the first P-type heavily doped region, the first N-type heavily doped region, the second P-type heavily doped region, the second N-type heavily doped region, the P-well, the first deep N-well, the second deep N-well, the first N-well, the second N-well and the P-type substrate being as the latch-up structure;

or, in the chip layout, finding a first N-type heavily doped region connected to the first input/output pad and located in the second deep N-well;

finding a first P-type heavily doped region located in the P-well and a second P-type heavily doped region located in the P-type substrate, both of which being adjacent to the first N-type heavily doped region;

finding a second N-type heavily doped region adjacent to the first P-type heavily doped region and located in the first N-well, wherein the P-well is located in the first deep N-well, the first deep N-well is located in the first N-well, the second deep N-well is located in the second N-well, and the first N-well and the second N-well are both located on the P-type substrate; and identifying an area formed by the first P-type heavily doped region, the first N-type heavily doped region, the second P-type heavily doped region, the second N-type heavily doped region, the P-well, the first deep N-well, the second deep N-well, the first N-well, the second N-well and the P-type substrate as the latch-up structure.

8. The method of claim 7, wherein finding the first N-type heavily doped region located in the second deep N-well and the second N-type heavily doped region located in the first N-well, both of which being adjacent to the first P-type heavily doped region comprises:

identifying, by taking the first P-type heavily doped region as a center and a preset distance as a radius, the first N-type heavily doped region and the second N-type heavily doped region, the distances of which to the first P-type heavily doped region being less than the preset distance; and finding the first P-type heavily doped region located in the P-well and the second P-type heavily doped region located in the P-type substrate, both of which being adjacent to the first N-type heavily doped region comprises:

identifying, by taking the first N-type heavily doped region as a center and a preset distance as a radius, the first P-type heavily doped region and the second P-type heavily doped region, the distances of which to the first N-type heavily doped region being less than the preset distance.

9. The method of claim 7, wherein finding the first P-type heavily doped region connected to the first input/output pad and located in the P-well comprises:

finding the first P-type heavily doped region directly or indirectly connected to the first input/output pad and located in the P-well; and finding the first N-type heavily doped region connected to the first input/output pad and located in the second deep N-well comprises:

finding the first N-type heavily doped region directly or indirectly connected to the first input/output pad and located in the second deep N-well.

\* \* \* \* \*